United States Patent
Mann et al.

(10) Patent No.: US 9,541,841 B2
(45) Date of Patent: Jan. 10, 2017

(54) IMAGING OPTICAL SYSTEM AND PROJECTION EXPOSURE INSTALLATION FOR MICROLITHOGRAPHY INCLUDING SAME

(71) Applicant: Carl Zeiss SMT GmbH, Oberkochen (DE)

(72) Inventors: Hans-Juergen Mann, Oberkochen (DE); Alexander Epple, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 662 days.

(21) Appl. No.: 13/692,030

(22) Filed: Dec. 3, 2012

(65) Prior Publication Data

US 2013/0088701 A1    Apr. 11, 2013

Related U.S. Application Data

(63) Continuation of application No. PCT/EP2010/061089, filed on Jul. 30, 2010.

(51) Int. Cl.
*G03F 7/20* (2006.01)
*G02B 17/06* (2006.01)

(52) U.S. Cl.
CPC ....... *G03F 7/70191* (2013.01); *G02B 17/0663* (2013.01); *G03F 7/70233* (2013.01)

(58) Field of Classification Search
CPC ............. G02B 17/0663; G03F 7/70191; G03F 7/70233
See application file for complete search history.

(56) References Cited

U.S. PATENT DOCUMENTS

| | | | |
|---|---|---|---|
| 2002/0129328 A1 | 9/2002 | Komatsuda et al. |
| 2002/0154395 A1 | 10/2002 | Mann et al. |
| 2003/0169411 A1 | 9/2003 | Ota et al. |
| 2006/0232867 A1 | 10/2006 | Mann et al. |

(Continued)

FOREIGN PATENT DOCUMENTS

| | | |
|---|---|---|
| EP | 1 806 610 A1 | 7/2007 |
| JP | 2002-139672 A | 5/2002 |

(Continued)

OTHER PUBLICATIONS

The International Search Report for the corresponding PCT Application No. PCT/EP2010/061089, mailed Jun. 22, 2011.

(Continued)

*Primary Examiner* — Michelle M Iacoletti
(74) *Attorney, Agent, or Firm* — Fish & Richardson P.C.

(57) ABSTRACT

An imaging optical system has a plurality of mirrors which image an object field in an object plane into an image field in an image plane. The imaging optical system has a pupil obscuration. The last mirror in the beam path of the imaging light between the object field and the image field has a through-opening for the passage of the imaging light. A penultimate mirror of the imaging optical system in the beam path of the imaging light between the object field and the image field has no through-opening for the passage of the imaging light. The imaging optical system has precisely eight mirrors. The result is an imaging optical system which exhibits a favorable combination of small imaging errors, manageable production and good throughput.

24 Claims, 6 Drawing Sheets

(56) References Cited

U.S. PATENT DOCUMENTS

| | | | |
|---|---|---|---|
| 2007/0047069 A1* | 3/2007 | Mann | G02B 17/0657 |
| | | | 359/365 |
| 2007/0058269 A1 | 3/2007 | Mann et al. | |
| 2008/0118849 A1 | 5/2008 | Chandock et al. | |
| 2008/0137183 A1 | 6/2008 | Mann et al. | |
| 2008/0170310 A1 | 7/2008 | Mann | |
| 2008/0247067 A1 | 10/2008 | Sasaki et al. | |
| 2009/0051890 A1* | 2/2009 | Mann et al. | 355/67 |
| 2011/0075151 A1* | 3/2011 | Jeong | 356/453 |
| 2012/0008124 A1* | 1/2012 | Mann et al. | 355/67 |
| 2012/0069312 A1 | 3/2012 | Mann et al. | |

FOREIGN PATENT DOCUMENTS

| | | |
|---|---|---|
| JP | 2002-162566 | 6/2002 |
| JP | 2005-276933 | 10/2005 |
| JP | 2008-258461 | 10/2008 |
| TW | 200632372 | 9/2006 |
| WO | WO 2009/052925 | 4/2009 |
| WO | WO 2009/052932 A1 | 4/2009 |
| WO | WO 2009/052962 | 4/2009 |
| WO | WO 2009/115180 A1 | 9/2009 |
| WO | WO 2010/006678 | 1/2010 |
| WO | WO 2010/091800 | 8/2010 |

OTHER PUBLICATIONS

Taiwanese office action and search report, with English translation thereof, for TW Appl No. 100 126 957, dated Feb. 10, 2014.

Japanese office action, with English translation thereof, for JP Appl No. 2013-520978, dated May 22, 2014.

Japanese office action with English translation with respect to Japanese patent application No. 2013-520 978, dated Apr. 30, 2015.

Chinese office action, with English translation thereof, for CN Appl No. 2010 8006 8347.X, dated Sep. 25, 2014.

* cited by examiner

IMAGING OPTICAL SYSTEM AND PROJECTION EXPOSURE INSTALLATION FOR MICROLITHOGRAPHY INCLUDING SAME

CROSS-REFERENCE TO RELATED APPLICATION

This application is a continuation of, and claims priority under 35 U.S.C. §120 to, international patent application serial number PCT/EP2010/061089, the entire contents of which are incorporated by reference herein.

FIELD

The disclosure relates to an imaging optical system with a plurality of mirrors which image an object field in an object plane into an image field in an image plane. Furthermore, the disclosure relates to a projection exposure installation with such an imaging optical system, a method for producing a microstructured or nanostructured component with such a projection exposure system, and a microstructured or nanostructured component produced by such a method.

BACKGROUND

WO 2010/006678 A1, US 2006/0232867 A1 and US 2008/0170310 A1 disclose imaging optical systems with a plurality of mirrors which image an object field in an object plane into an image field in an image plane.

SUMMARY

The disclosure seeks to provide an imaging optical system that exhibits a favorable combination of small imaging errors, manageable production and good throughput.

The disclosure recognizes that a pupil-obscured system (an imaging optical system with a pupil obscuration) can be configured with the penultimate mirror having a continuous reflective face (without a through-opening within the optically used region of the penultimate mirror) such that the system does not exhibit relatively large losses in imaging quality. Thus, the penultimate mirror can have an adequate mirror thickness, while allowing for an adequately large spacing between the side of the penultimate mirror facing the image plane and the image plane, and while also minimizing the size of the pupil obscuration. This can be particularly important if the penultimate mirror is arranged on a mirror body and/or a mirror carrier which is thin in comparison to the other mirrors.

The numerical value for the pupil obscuration is produced by the ratio of the area within the exit pupil masked because of the pupil obscuration relative to a total area of an exit pupil of the imaging optical system. A pupil obscuration, which is less than 10%, makes possible a pupil obscured imaging optical system with a particularly high light throughput. Furthermore, the small obscuration according to the disclosure may lead to a small or negligible influence on an imaging quality of the imaging optical system, in particular on the imaging contrast. The pupil obscuration may be less than 8%, such as 7.8%. The pupil obscuration may be less than 7%, such as 6.3%. The pupil obscuration may be less than 5%, such as 4.4%. The pupil obscuration may be less than 4%, such as 3.3%. The pupil obscuration may be less than 3%. The pupil obscuration of the imaging optical system may be predetermined by one of the mirrors, for example by a through-opening thereof or by an outer edging thereof, or by an obscuration stop or diaphragm, which is arranged in the beam path of the imaging light between the object field and the image field.

At least one of the mirrors of the imaging optical system according to one of the two aspects described above may have a reflection face which is designed as a free-form face which cannot be described by a rotationally symmetric function.

A ratio of an area within an outer boundary of a reflective useful surface area of a last mirror in the beam path of imaging light between the object field and the image field and an area of a through-opening of the last mirror may be larger than 20. Such a ratio has advantages corresponding to those discussed above referring to the low pupil obscuration.

A numerical aperture of at least 0.5 allows high resolution of the imaging optical system. The numerical aperture may be higher than 0.5 and may be as high as 0.7 or even higher.

A product of a working spacing of the penultimate mirror and an image side numerical aperture of the imaging optical system higher than 10 mm additionally facilitates its production. The working spacing may be 14 mm, may be 17.5 mm, may be at least 20 mm, may be 21.7 mm and may be 24.5 mm. Even larger values for the working spacing are possible. The working spacing is defined as the spacing between the image plane and the portion closest thereto of a used reflection face of the closest mirror, in other words the penultimate mirror of the projection optical system. The image plane is the field plane, which is adjacent to the penultimate mirror, of the imaging optical system.

At least one intermediate image between the object and image fields leads to the possibility of guiding an imaging beam path section of the beam path of the imaging light between the object field and the image field closely past further components of the imaging optical system. The intermediate image may, in particular, be arranged in the region of the through-opening of the last mirror, which makes a small pupil obscuration possible. The imaging optical system may have precisely one intermediate image. The imaging optical system may also have more than one intermediate image and may, in particular, have two intermediate images in the beam path of the imaging light between the object field and the image field. A plurality of intermediate images may also be used to for correcting imaging errors or simplifying the design of the mirror forms involved. Precisely two intermediate images may be present.

In some embodiments, the average angle of incidence on an individual point on the penultimate mirror in the beam path between the object field and the image field is smaller than 25° for all points on the used reflective surface of this mirror. Such embodiments can facilitate the configuration of a highly reflective coating on the mirrors of the imaging optical system. An average angle of incidence smaller than 25° is advantageous, in particular, if imaging light with a small wavelength is used, for example with DUV (Deep Ultraviolet), VUV (Vacuum Ultraviolet), or EUV (Extreme Ultraviolet) wavelengths. A multi-layer coating with a small acceptance bandwidth of the angle of incidence and a correspondingly high reflection may then be used, in particular. The average angle of incidence on the penultimate mirror may be smaller than 24°, smaller than 23°, smaller than 22° and may be as high as 21.7°.

A bandwidth/maximum field dimension ratio of less than 1.00°/mm helps to enable a design of a highly reflective coating having surface portions which are adapted to the individual angle of incidence bandwidths on the reflective surface portions covered by these coating portions. This ratio may be smaller than 0.90°/mm, smaller than 0.80°/mm, smaller than 0.70°/mm, smaller than 0.60°/mm and may be as high as 0.595°/mm.

An angle between a chief ray of a central object field point and a normal to the object plane of more than 5° helps to realize an illumination of a reflective object without shadowing. The angle between the chief ray and the normal may be more than 6°, more than 8° (e.g., 11°) or may be even more than 11°, depending on the numerical aperture at the object side of the imaging optical system. A chief ray angle of incidence of a central field point of the object field (CRA center) for all mirrors may be smaller than 25°, may be as high as 23.1°, may be as high as 20.7°, may be smaller than 20°, may be as high as 18.0°, may be as high as 17.2°, may be smaller than 15° and may be even as high as 13.0°. This also helps to design high reflective coatings on the mirrors of the imaging optical system.

A convex penultimate mirror keeps this mirror small. This may avoid mirror thickness problems.

Other combinations of the above mentioned features of the different aspects of the disclosure also are possible.

When using the imaging optical in a projection exposure installation for microlithography, its advantages stand out, in particular.

The advantages of a projection exposure installation according to the disclosure correspond to those which noted above with respect to the imaging optical system according to the disclosure. The light source of the projection exposure installation may be wide band in design and for example have a bandwidth, which may be greater than 0.1 nm, greater than 1 nm, greater than 10 nm or greater than 100 nm. In addition, the projection exposure installation may be designed such that it can be operated with light sources of different wavelengths. Light sources for other wavelengths used, in particular, for microlithography, can be used in conjunction with the imaging optical system according to the disclosure. Examples of such light sources include light sources with the wavelengths 365 nm, 248 nm, 193 nm, 157 nm, 126 nm, 109 nm and, in particular, also with wavelengths, which are less than 100 nm, for example between 5 nm and 30 nm.

The light source of the projection exposure installation may be configured to produce illumination light with a wavelength of between 5 nm and 30 nm. A light source of this type uses reflection coatings on the mirrors which, in order to fulfil a minimum reflectivity, have only a small angle of incidence acceptance bandwidth. Together with the imaging optical system according to the disclosure, the desire for a small angle of incidence acceptance bandwidth can be fulfilled.

Corresponding advantages apply to a production method according to the disclosure and the microstructured or nanostructured component produced thereby.

BRIEF DESCRIPTION OF THE DRAWINGS

Embodiments of the disclosure will be described in more detail below with the aid of the drawings, in which.

DETAILED DESCRIPTION

Figure 1:
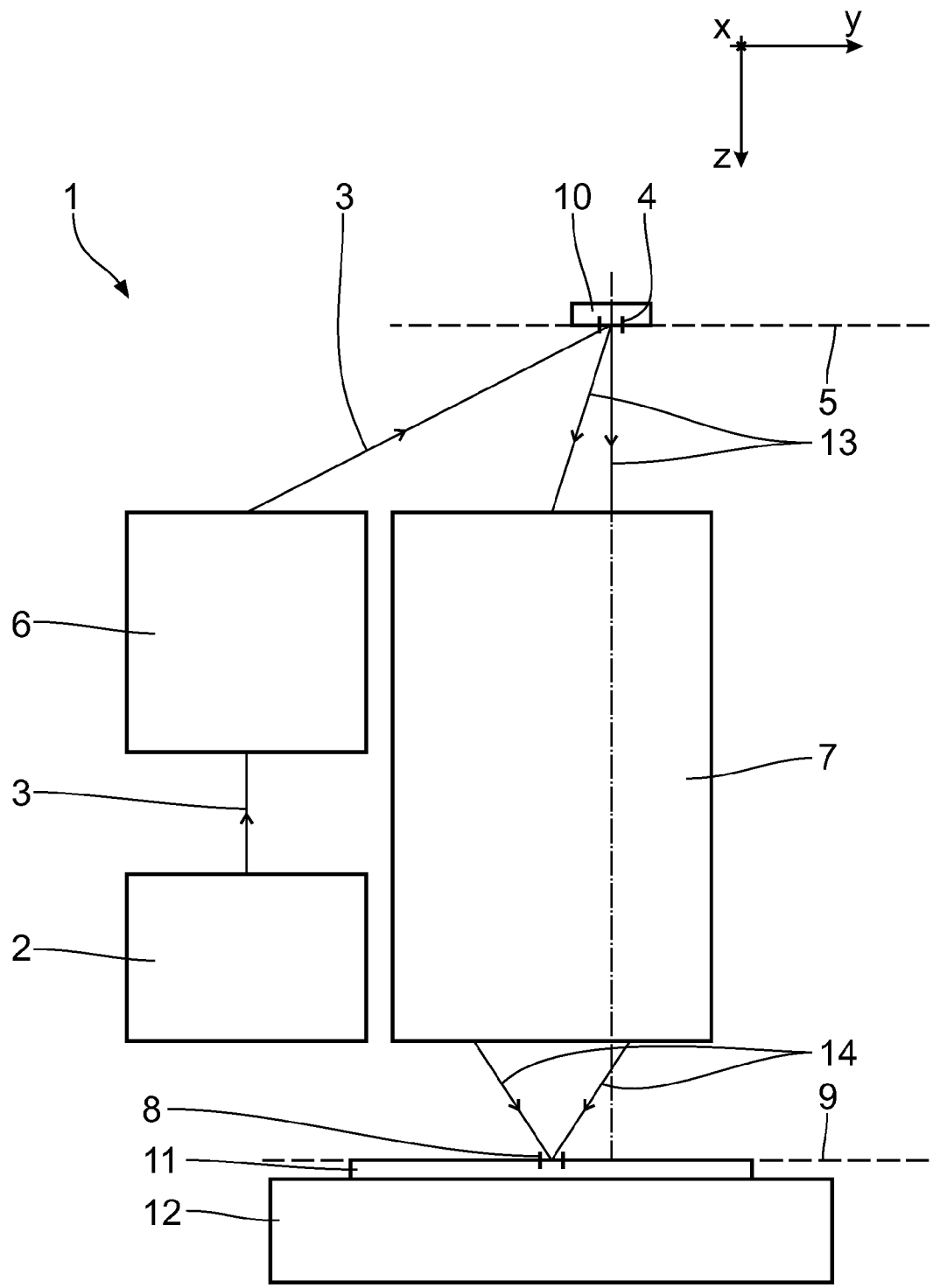
FIG. 1 schematically shows a projection exposure installation for EUV microlithography.

A projection exposure installation 1 for microlithography has a light source 2 for illumination light or imaging light 3. The light source 2 is an EUV light source which produces light in a wavelength range of, for example, between 5 nm and 30 nm, in particular between 5 nm and 15 nm. The light source 2 may, in particular, be a light source with a wavelength of 13.5 nm or a light source with a wavelength of 6.9 nm. Other EUV wavelengths are also possible. In general, any wavelengths, for example visible wavelengths or else other wavelengths, which can be used in microlithography and are available for the suitable laser light sources and/or LED light sources (for example 365 nm, 248 nm, 193 nm, 157 nm, 129 nm, 109 nm), are even possible for the illumination light 3 guided in the projection exposure installation 1. A beam path of the illumination light 3 is shown extremely schematically in FIG. 1.

An illumination optical system 6 is used to guide the illumination light 3 from the light source 2 to an object field 4 in an object plane 5. The object field 4 is imaged in an image field 8 in an image plane 9 with the predetermined reduction scale using a projection optical system or an imaging optical system 7. The image field 8, in the x-direction, has an extent of 26 mm and, in the y-direction, an extent of 2 mm. The image field 8, in the x-direction may alternatively have an extent of 13 mm and, in the y-direction, an extent of 3 or even 4 mm. The object field 4 and the image field 8 are rectangular. The object field 4 and the image field 8 alternatively may have the form of a ring section or of an arc. Such field form is known as ring field.

Figure 2:
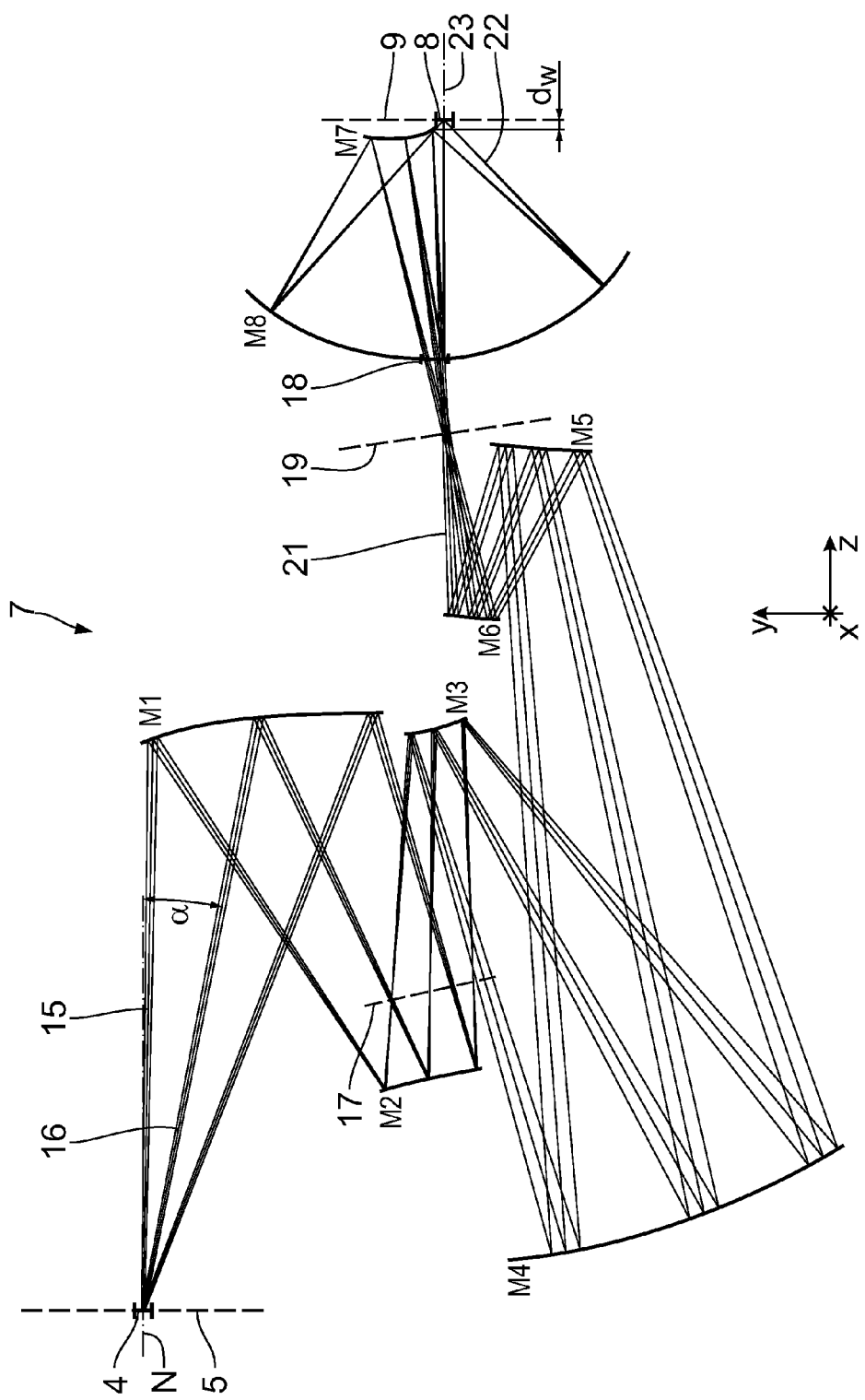
FIG. 2 shows, in a meridional section, an embodiment of an imaging optical system, which can be used as a projection optical system in the projection exposure installation according to FIG. 1, the imaging beam path being shown (virtually) for the main beams and being shown for the upper and lower coma beam of a plurality of selected field points.

One of the embodiments shown in FIG. 2 can be used for the projection optical system 7. The projection optical system 7 according to FIG. 2 reduces by a factor of 4. Other reduction scales are also possible, for example 5×, 8× or else reduction scales which are greater than 8×. The image plane 9 in the projection optical system 7 in the embodiments according to FIG. 2 is arranged parallel to the object plane 5. Imaged here during use of the projection exposure installation 1 is a portion, which coincides with the object field 4, of a reflection mask 10, which is also called a reticle. The reflection mask 10 is carried by a reticle holder which is not shown.

The imaging by the projection optical system 7 takes place on the surface of a substrate 11 in the form of a wafer, which is carried by a substrate holder 12. FIG. 1 schematically shows, between the reticle 10 and the projection optical system 7, a beam bundle 13 of the illumination light 3 running therein, and, between the projection optical system 7 and the substrate 11, a beam bundle 14 of the illumination light 3 leaving the projection optical system 7. A numerical aperture (NA) on the image field side of the projection optical system 7 in the embodiment according to FIG. 2 is 0.70. This is not represented to scale in FIG. 1.

To facilitate the description of the projection exposure installation 1 and the various embodiments of the projection optical system 7, a Cartesian xyz-coordinate system is given in the drawing, from which the respective position reference of the components shown in the figures emerges. In FIG. 1, the x-direction runs perpendicular to the plane of the drawing and into it. The y-direction extends to the right and the z-direction downward.

The projection exposure installation 1 is of the scanner type. Both the reticle 10 and the substrate 11 are scanned during operation of the projection exposure installation 1 in the y-direction. A stepper type of the projection exposure installation 1, in which a stepwise displacement of the reticle 10 and the substrate 11 in the y-direction takes place in between individual exposures of the substrate 11, also is possible.

FIG. 2 shows the optical design of a first embodiment of the projection optical system 7. FIG. 2 shows the beam path of three respective individual beams 15, which respectively issue from three object field points spaced apart from one another in the y-direction in FIG. 2. The three individual beams or rays 15, which belong to one of these three object field points, are in each case associated with three different illumination directions for the three object field points. Main beams or chief rays 16, which run through the center of a pupil in a pupil plane 17 of the projection optical system 7, are drawn in FIG. 2 only for graphical reasons as these are not real, but virtual imaging beam paths of the projection optical system 7 because of a central pupil obscuration of the projection optical system 7. These main beams 16 firstly run divergently, proceeding from the object plane 5. This is also called a negative back focal distance of an entry pupil of the projection optical system 7 below. The entry pupil of the projection optical system 7 according to FIG. 2 is not located within the projection optical system 7, but in the beam path in front of the object plane 5. This makes it possible, for example, to arrange a pupil component of the illumination optical system 6 in the entry pupil of the projection optical system 7 in the beam path in front of the projection optical system 7, without further imaging optical components having to be present between this pupil component and the object plane 5.

The main beam 16 of a central field point of the object field 4 includes an angle α with a normal N to the object plane 5 of 11°. Therefore, there is no overlapping area between the individual beam 15 incident on the reflection mask 10 and the individual beams 15 reflected from the reflection mask 10. Consequently, there is no overlap of the individual light beam 15 of the projection optical system 7 at the reflection mask 10.

The projection optical system 7 according to FIG. 2 has a total of eight mirrors, which are numbered consecutively by M1 to M8 in the order of their arrangement in the beam path of the individual beams 15, proceeding from the object field 4. FIG. 2 shows the calculated reflection faces or reflection surfaces of the mirrors M1 to M8. The terms "face" and "surface" are used interchangeably when referring to the mirrors. Only a small region of these calculated reflection faces is used, as can be seen in the view of FIG. 2. Only this actually used region of the reflection faces is actually present in the real mirrors M1 to M8. These useful reflection faces are carried in a known manner by mirror bodies.

The pupil plane 17 is located in the vicinity of mirror M2.

All reflection surfaces of the eight mirrors M1 to M8 of the projection optical system 7 are designed as free-form faces which cannot be described by a rotationally symmetrical function. Other embodiments of the projection optical system 7 are also possible, in which at least one of the mirrors M1 to M8 has a free-form reflection face of this type.

A free-form face of this type may also be produced from a rotationally symmetrical reference face. Free-form faces of this type for reflection faces of the mirrors of projection optical systems of projection exposure installation for microlithography are known from US 2007-0058269 A1.

The free-form face can be described mathematically by the following equation:

$$Z = \frac{cr^2}{1+\sqrt{1-(1+k)c^2r^2}} + \sum_{j=2}^{N} \frac{C_j}{R^{n+m}} X^m Y^n \quad (1)$$

wherein there applies:

$$j = \frac{(m+n)^2 + m + 3n}{2} + 1 \quad (2)$$

Z is the rising height (sagitta) of the free-form face at the point x, y ($x^2+y^2=r^2$). R (N radius) is a normalisation radius for the point coordinates x, y, which is useful for the optimization of the system.

c is a constant, which corresponds to the vertex curvature of a corresponding asphere. k corresponds to a conical constant of a corresponding asphere. $C_j$ are the coefficients of the monomials $X^m Y^n$. Typically, the values of c, k and $C_j$ are determined on the basis of the desired optical properties of the mirror within the projection optical system 7. The order of the monomial, m+n, may be varied as desired. A monomial of a higher order may lead to a design of the projection optical system with improved image error correction, but is more complex to calculate. m+n may adopt values of between 3 and more than 20.

Free-form faces can also be described mathematically by Zernike polynomials, which are described, for example, in the manual of the optical design programme CODE V®. Alternatively, free-form faces may be described with the aid of two-dimensional spline surfaces. Examples of this are Bezier curves or non-uniform rational basis splines (NURBS). Two-dimensional spline surfaces may, for example, be described by a network of points in an xy-plane and associated z-values or by these points and gradients associated with them. Depending on the respective type of spline surface, the complete surface is obtained by interpolation between the network points using, for example, polynomials or functions, which have specific properties with regard to their continuity and differentiability. Examples of this are analytical functions.

The mirrors M1 to M8 have multiple reflection layers to optimise their reflection for the impinging EUV illumination light 3. The reflection can better optimised as by using an impingement angle of the individual beams 15 on the mirror surface that is close to being the perpendicular incidence (=angle of incidence 0°). The projection optical system 7 has small angles of incidence or small angles of incidence bandwidths, respectively, overall for all the individual beams 15.

The optical design data of the reflection faces of the mirrors M1 to M8 of the projection optical system 7 can be inferred from the following tables. The first of these tables gives, for the optical surfaces of the optical components and for the aperture diaphragm, the respective reciprocal value of the vertex curvature (radius) and a spacing value (thickness), which corresponds to the z-spacing of adjacent elements in the beam path, proceeding from the object plane. The second table (split in two sub-tables) gives the coefficients $C_j$ of the monomials $X^m Y^n$ in the free-form face equation given above for the mirrors M1 to M8. Nradius is in this case a normalisation factor. According to the last of the following tables, the amount is still given in mm, along which the respective mirror, proceeding from a mirror reference design, has been decenterd (Y-decenter) and rotated (X-rotation). This corresponds to a parallel displacement and a tilting in the free-form face design method. The displacement takes place here in the y-direction and the tilting is about the x-axis. The rotation angle is given in degrees here.

| Surface | Radius | Thickness | Mode |
|---|---|---|---|
| Object | INFINITY | 1200.000 | |
| M1 | −2291.279 | −721.101 | REFL |
| M2 | −2003.251 | 721.324 | REFL |
| M3 | 2576.831 | −1000.223 | REFL |
| M4 | 2933.302 | 1568.268 | REFL |
| M5 | 3515.962 | −368.266 | REFL |
| M6 | 1901.114 | 1025.084 | REFL |
| M7 | 137.804 | −456.818 | REFL |
| M8 | 516.359 | 496.814 | REFL |
| Image | INFINITY | 0.000 | |

| Coefficient | M1 | M2 | M3 | M4 | M5 |
|---|---|---|---|---|---|
| K | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 |
| X2 | −2.583555E+00 | 0.000000E+00 | 1.447001E−04 | 5.575002E+00 | −2.092041E+00 |
| Y2 | −2.777209E+00 | 0.000000E+00 | 1.026582E−03 | 9.156611E+00 | −2.486951E+00 |
| X2Y | −5.651962E−02 | 0.000000E+00 | 2.744576E−06 | 2.336900E+00 | 1.429302E+00 |
| Y3 | −1.668574E−02 | 0.000000E+00 | 4.060185E−06 | 8.160836E−01 | −1.016992E−01 |
| X4 | −2.033344E−02 | 0.000000E+00 | 9.803208E−10 | −2.278315E−02 | 5.647148E−03 |
| X2Y2 | −2.968910E−02 | 0.000000E+00 | 1.183307E−08 | −2.780811E−01 | 2.701739E−01 |
| Y4 | 9.759889E−04 | 0.000000E+00 | 2.640505E−08 | 1.479631E−01 | 5.150062E−02 |
| X4Y | −3.598485E−03 | 0.000000E+00 | 1.134972E−12 | 5.657643E−02 | 2.114215E−02 |
| X2Y3 | −9.046151E−04 | 0.000000E+00 | 6.247968E−11 | 9.226891E−02 | 4.867422E−03 |
| Y5 | 3.741070E−03 | 0.000000E+00 | 1.299612E−10 | −2.185467E−02 | −3.988814E−03 |
| X6 | −2.103255E−16 | 0.000000E+00 | −7.216545E−16 | 9.054253E−04 | −1.973354E−03 |
| X4Y2 | −6.003027E−04 | 0.000000E+00 | 9.193934E−15 | 4.957745E−03 | −1.147834E−02 |
| X2Y4 | −1.978591E−04 | 0.000000E+00 | 1.622452E−13 | 8.222083E−03 | 1.714515E−02 |
| Y6 | 3.369030E−04 | 0.000000E+00 | 5.428281E−13 | 9.780579E−03 | 5.674116E−03 |
| X6Y | 0.000000E+00 | 0.000000E+00 | 0.000000E+00 | 0.000000E+00 | 0.000000E+00 |
| X4Y3 | 0.000000E+00 | 0.000000E+00 | 0.000000E+00 | 0.000000E+00 | 0.000000E+00 |
| X2Y5 | 0.000000E+00 | 0.000000E+00 | 0.000000E+00 | 0.000000E+00 | 0.000000E+00 |
| Y7 | 0.000000E+00 | 0.000000E+00 | 0.000000E+00 | 0.000000E+00 | 0.000000E+00 |
| Nradius | 1.391729E+02 | 1.924891E+02 | 1.000000E+00 | 2.811102E+02 | 1.077461E+02 |

| Coefficient | M6 | M7 | M8 |
|---|---|---|---|
| K | 0.000000E+00 | 0.000000E+00 | 0.000000E+00 |
| Y | 0.000000E+00 | 0.000000E+00 | 0.000000E+00 |
| X2 | −8.263503E+00 | −1.682864E+01 | −4.040081E+00 |
| Y2 | −1.516445E+01 | −1.380463E+01 | −3.811332E+00 |
| X2Y | 5.785794E+00 | 2.047755E+00 | −4.693519E−01 |
| Y3 | −9.306398E+00 | 2.433397E−01 | −5.801486E−01 |
| X4 | 4.536839E+00 | −1.442417E+00 | −4.424168E−01 |
| X2Y2 | 1.070774E+01 | −2.463768E+00 | −7.944757E−01 |
| Y4 | 2.286186E−01 | −1.025649E+00 | −4.497498E−01 |
| X4Y | −1.781246E+01 | 1.209715E−01 | −4.360223E−02 |
| X2Y3 | 1.163379E+01 | 5.563821E−01 | −1.074160E−01 |
| Y5 | 2.186199E+00 | 5.944520E−02 | −8.221248E−02 |
| X6 | 1.605002E−01 | −2.528658E−01 | −9.499689E−02 |
| X4Y2 | 1.541706E+01 | −3.429063E−01 | −2.645639E−01 |
| X2Y4 | −1.764890E+01 | −1.428302E−01 | −2.260894E−01 |
| Y6 | 1.812547E+00 | 1.506507E−01 | −8.217212E−02 |
| X6Y | −2.901797E−01 | 3.419002E−01 | 3.739826E−02 |
| X4Y3 | −3.985797E+00 | 9.137173E−01 | 1.065627E−01 |
| X2Y5 | 5.369717E+00 | 8.108382E−01 | 9.148989E−02 |
| Y7 | −1.082760E+00 | 3.442016E−01 | 2.226480E−02 |
| Nradius | 2.296772E+02 | 9.125522E+01 | 3.502938E+02 |

| Coefficient | M1 | M2 | M3 | M4 | M5 | M6 | M7 | M8 | Image |
|---|---|---|---|---|---|---|---|---|---|
| Y-decenter | 109.822 | −405.604 | −406.642 | −968.718 | −850.892 | −739.383 | −333.045 | −369.405 | 0.000 |
| X-rotation | 13.898 | 12.104 | 12.840 | 20.528 | −4.904 | −9.666 | 3.111 | −2.502 | 0.000 |

The mirrors M3 and M6 as well as the mirrors M5 and M8 are arranged back to back with regard to the orientation of their reflection faces.

The mirrors M1 to M3, M5 and M6 have negative chief ray magnification. A definition of the parameter "chief ray magnification" can be found in U.S. Pat. No. 7,414,781. The mirrors M4 and M7 have a positive chief ray magnification.

The optically used regions of the mirrors M1 to M6 have no through-opening within the optically used region for the passage of imaging light, in other words are not obscured. The mirror M7, in other words the penultimate mirror in the beam path of the illumination light 3 between the object field 4 and the image field 8, also has no through-opening for the passage of the imaging light or illumination light 3. The mirror M7, in other words, may be provided with an uninterrupted useable reflection face.

In the imaging beam path between the mirrors M6 and M7, the individual beams 15 pass through a through-opening 18 in the mirror M8. The mirror M8 is used around the through-opening 18. The mirror M8 is thus an obscured mirror.

The pupil plane 17 lies in the imaging beam path between the object field 4 and the through-opening 18 of the mirror M8. An obscuration stop or diaphragm for central shading of a pupil of the projection optical system 7 may be arranged in the pupil plane 17 and in particular may be arranged on the mirror M2. The obscuration diaphragm thus shades the central region of the imaging light 3 in the pupil plane 17 which does not contribute to the imaging of the object field 4 because of the through-opening 18.

An intermediate image plane 19 of the projection optical system 7 is located in the imaging beam path between the mirrors M6 and M7. The associated intermediate image is located nearby the through-opening 18 in the mirror M8. As a result it is possible to make this through-opening 18 small in comparison to the used reflection face of the mirror M8.

A central pupil obscuration, in other words the ratio of an area blanked by the through-opening 18 or the obscuration diaphragm in the pupil plane 17 within an exit pupil of the projection optical system 7 relative to an overall face of this exit pupil or relative to an area within an outer boundary of the reflective useful surface of the mirror M8, is 4.0% in the projection optical system 7.

A working spacing $d_w$ between the image plane 9 and the portion closest to the image plane of a used reflection face of the mirror M7 is 20 mm.

A ratio of this working spacing $d_w$ to the overall length of the projection optical system 7, in other words to the spacing between the object field 4 and the image field 8, is 0.8%. The product of this working spacing $d_w$ and the image side numerical aperture NA is 20 mm×0.7=14 mm.

A further pupil plane of the projection optical system 7 is located in the imaging beam path in the region of the mirror M7. A diaphragm may also be arranged here.

Over its full reflective used surface, the mirror M1 sees average angles of incidence of the incoming individual beams 15 in a range between 17.3° and 18.5°. On given points on the reflective used surface, the mirror M1 sees individual angles of incidence bandwidths BWi of the incoming individual beams 15 in a range between 0.014° and 0.562°. The centers of these individual angles of incidence bandwidths are given by the average angle of incidence mentioned above, respectively.

Over its full reflective used surface, the mirror M2 sees average angles of incidence of the incoming individual beams in a range between 6.52° and 19.6°. On given points on the reflective used surface, the mirror M2 sees individual angle of incidence bandwidths BWi of the incoming individual beams in a range between 0.122° and 3.17°. The centers of these individual angles of incidence bandwidths are given by the average angle of incidence mentioned above, respectively.

Over its full reflective used surface, the mirror M3 sees average angles of incidence of the incoming individual beams 15 in a range between 8.57° and 19.7°. On given points on the reflective used surface, the mirror M3 sees individual angle of incidence bandwidths BWi of the incoming individual beams 15 in a range between 0.06° and 3.96°. The centers of these individual angles of incidence bandwidths are given by the average angle of incidence mentioned above, respectively.

Over its full reflective used surface, the mirror M4 sees average angles of incidence of the incoming individual beams 15 in a range between 5.43° and 10.8°. On given points on the reflective used surface, the mirror M4 sees individual angle of incidence bandwidths BWi of the incoming individual beam 15 in a range between 0.03° and 1.07°. The centers of these individual angles of incidence bandwidths are given by the average angle of incidence mentioned above, respectively.

Over its full reflective used surface, the mirror M5 sees average angles of incidence of the incoming individual beams 15 in a range between 8.81° and 23.9°. On given points on the reflective used surface, the mirror M5 sees individual angle of incidence bandwidths BWi of the incoming individual beams 15 in a range between 0.04° and 2.54°. The centers of these individual angles of incidence bandwidths are given by the average angle of incidence mentioned above, respectively.

Over its full reflective used surface, the mirror M6 sees average angles of incidence of the incoming individual beams 15 in a range between 8.71° and 21.5°. On given points on the reflective used surface, the mirror M6 sees individual angle of incidence bandwidths BWi of the incoming individual beams 15 in a range between 0.05° and 4.93°. The centers of these individual angles of incidence bandwidths are given by the average angle of incidence mentioned above, respectively.

Over its full reflective used surface, the mirror M7 sees average angles of incidence of the incoming individual beams 15 in a range between 5.11° and 21.7°. Therefore, the average angle of incidence on an individual point on this penultimate mirror M7 in the beam path between the optical field 4 and the image field 8 is for all points of the use reflective surface of this mirror M7 smaller than 25°. On given points on the reflective used surface, the mirror M7 sees individual angle of incidence bandwidths BWi of the incoming individual beams 15 in a range between 0.13° and 15.6°. The centers of these individual angles of incidence bandwidths are given by the average angle of incidence mentioned above, respectively. For all points on the used reflective surface of this penultimate mirror M7, a ratio of this bandwidth BWi of angles of incidence on an individual point on this penultimate mirror M7 and a maximum field dimension of the image field 8 is smaller than 1.00°/mm and is even as small as 15.5°/26 mm=0.60°/mm. As the dimensions of the image field 8 are 2 mm×26 mm, a maximum field dimension of 26 mm is present.

Over its full reflective used surface, the mirror M8 sees average angles of incidence of the incoming individual beams 15 in a range between 2.24° and 6.26°. On given points on the reflective used surface, the mirror M8 sees individual angle of incidence bandwidths BWi of the incoming individual beams 15 in a range 0.07° and 1.80°. The centers of these individual angles of incidence bandwidths are given by the average angle of incidence mentioned above, respectively.

The following table gives the values for the angle of incidence "CRA center" of the chief ray 16 of the central point of the object field for the mirrors M1 to M8 and for the maximum angle of incidence "AOI max" being present on those mirrors.

| Surface | CRA center [°] | AOI max [°] |
|---------|----------------|-------------|
| M1 | 18.0 | 18.7 |
| M2 | 12.9 | 19.7 |
| M3 | 14.9 | 19.7 |
| M4 | 8.4 | 10.8 |
| M5 | 16.0 | 24.0 |
| M6 | 14.0 | 21.6 |
| M7 | 0.9 | 28.0 |
| M8 | 4.9 | 6.5 |

An imaging beam path section 21 runs between the third to last mirror M6 in the imaging beam path and the penultimate mirror M7 in the imaging beam path. This imaging beam path section 21 begins at the reflection on the mirror M6 and ends at the reflection on the mirror M7. An imaging beam path section in the projection optical system 7 in front of the imaging beam path section 21, in other words the imaging beam path between the mirror M5 and the mirror M6, on the one hand, and an imaging light bundle 22 in the region of the image field 8, on the other hand, are guided on the same side of the imaging beam path section 21. Accordingly, the fourth to last mirror M5 and the penultimate mirror M7 are arranged on different sides of a main plane 23 which extends centrally through the image field 8 and is perpendicular to the meridional plane, in other words the plane of the drawing of FIGS. 2 to 4.

Figure 3:
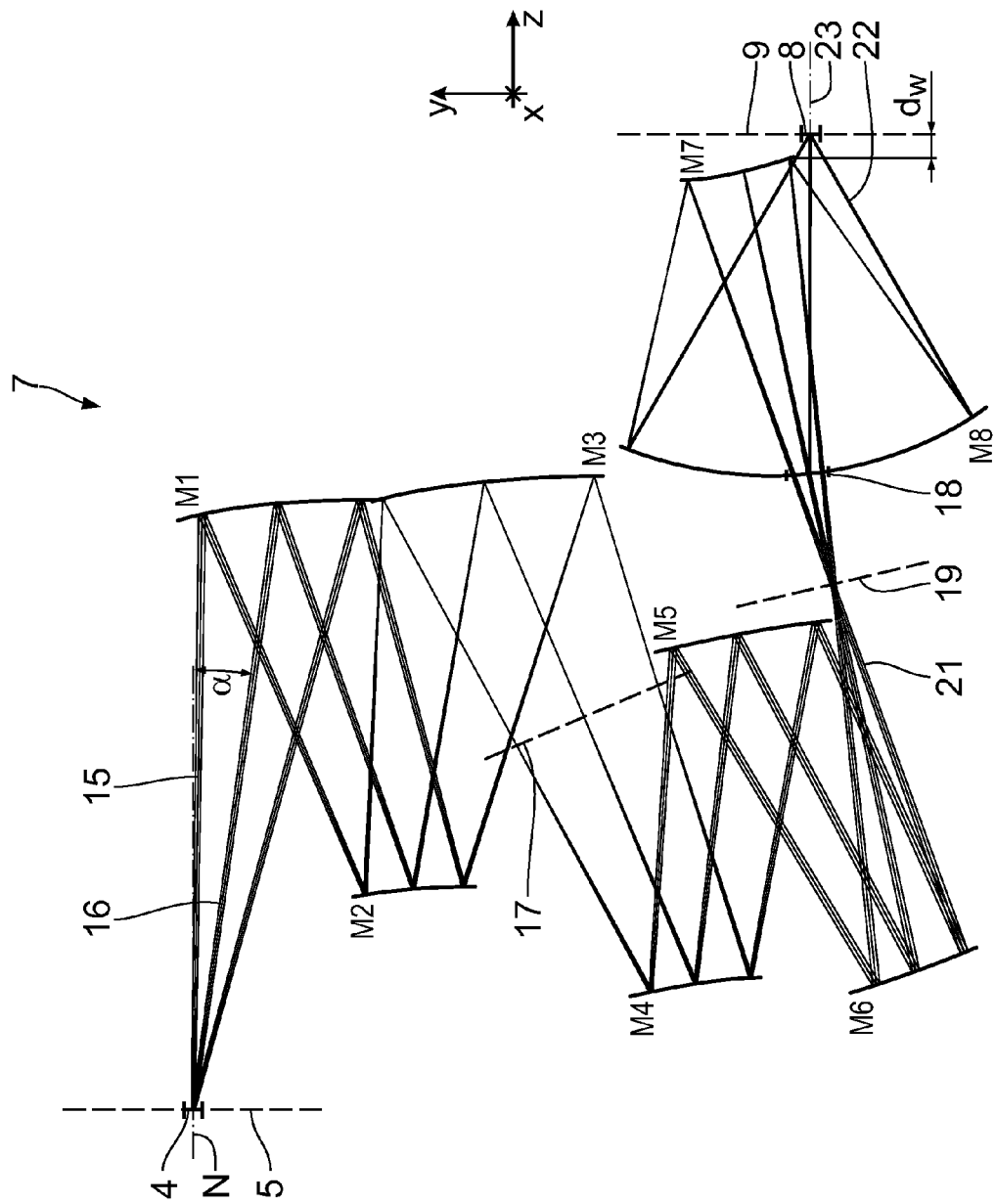
FIG. 3 to 6 show further embodiments of the imaging optical system in a view similar to FIG. 2.

FIG. 3 shows a further embodiment of the projection optical system 7. Components, which correspond to those of the projection optical system 7 according to FIG. 2, have the same reference numerals and are not discussed again in detail.

The main beam 16 of a central field point of the object field 4 includes in the embodiment of FIG. 3 an angle α with a normal N to the object plane 5 of 8°.

The free-form faces of the mirrors M1 to M8 of the projection optical system 7 according to FIG. 3 can be described mathematically by the following equation:

$$z(x, y) = \frac{CUX \cdot x^2 + CUY \cdot y^2}{1 + \sqrt{1 - (1 + KX)CUX^2 \cdot x^2 - (1 + KY)CUY^2 \cdot y^2}} + \sum_{i,j} c_{x^i y^j} x^i y^j$$

Again, Z is the rising height (sagitta) of the free-form face at the point x, y.

CUX is a constant which corresponds to the vertex curvature of a corresponding asphere in the xz-plane.

CUY is a constant which corresponds to the vertex curvature of a corresponding asphere in the yz-plane.

KX and KY correspond to the corresponding conical constant of the asphere. $c_{x^i y^j}$ are the coefficients of the monomials $x^i y^j$.

The optical design data of the projection optical system 7 according to FIG. 3 can be inferred from the following tables, which correspond to the tables on the projection optical system 7 according to FIG. 2 with respect to their structure.

| Surface | Thickness | Mode |
|---|---|---|
| Image | 571.386 | |
| M8 | −509.127 | REFL |
| M7 | 1348.747 | REFL |
| M6 | −568.726 | REFL |
| M5 | 587.610 | REFL |
| M4 | −448.515 | REFL |
| STOP | −396.964 | |
| M3 | 684.322 | REFL |
| M2 | −647.607 | REFL |
| M1 | 1023.241 | REFL |
| Object | 0.000 | |

| Coefficient | M8 | M7 | M6 | M5 | M4 |
|---|---|---|---|---|---|
| CUY | −1.539882E−03 | −1.553621E−03 | −3.587785E−04 | 5.929396E−04 | 1.027445E−03 |
| CUX | −1.539417E−03 | −1.151694E−03 | −3.559319E−04 | 6.218510E−04 | 1.288449E−03 |
| KY | −9.924827E−01 | 5.723258E+00 | −9.628619E+00 | −8.760332E+00 | −1.054227E−01 |
| KX | −1.020125E+00 | 9.748205E+00 | −6.519853E+00 | 1.557560E+00 | −3.192656E+00 |
| Y | 8.671319E−04 | 1.521800E−03 | −1.388342E−03 | 1.085084E−03 | 1.091377E−03 |
| X2 | −1.567505E−06 | 1.319409E−05 | 1.090480E−05 | 6.614097E−06 | −3.493007E−05 |
| Y2 | −1.687162E−07 | 1.397987E−05 | −8.314963E−06 | −5.228950E−05 | −3.806748E−05 |
| X2Y | 1.072245E−08 | 4.690675E−07 | −2.856840E−08 | −8.688776E−08 | −8.243271E−07 |
| Y3 | −2.575163E−08 | −5.109825E−07 | 6.662485E−09 | 2.031726E−08 | −6.799423E−08 |
| X4 | −4.979715E−10 | 6.742746E−11 | −4.523549E−11 | −7.042158E−11 | 3.751338E−10 |
| X2Y2 | −9.555778E−10 | 4.367088E−10 | −2.742838E−10 | −6.982697E−11 | −3.337873E−09 |
| Y4 | −4.951725E−10 | −3.523428E−09 | −2.925737E−12 | 2.672525E−10 | 4.193072E−10 |
| X4Y | 3.470478E−14 | 1.805977E−12 | −5.402053E−14 | −3.180062E−14 | 3.935045E−12 |
| X2Y3 | −6.140410E−14 | 2.341783E−12 | 8.849200E−14 | 9.283753E−14 | 4.908145E−13 |
| Y5 | −2.861989E−14 | 3.146241E−12 | 9.059537E−14 | 2.813392E−15 | −3.374316E−13 |
| X6 | −6.305164E−16 | 9.856099E−15 | −3.681521E−18 | −4.720919E−17 | −2.884068E−15 |
| X4Y2 | −1.808028E−15 | 3.812533E−14 | −5.159626E−16 | −4.326056E−16 | −2.693415E−14 |
| X2Y4 | −1.902746E−15 | 4.903754E−14 | −1.402602E−16 | −3.028284E−16 | −1.116038E−14 |
| Y6 | −6.576415E−16 | 9.808178E−15 | −5.672955E−16 | −1.090624E−15 | −3.276193E−14 |
| X6Y | 7.608342E−20 | 5.198938E−17 | −6.722422E−20 | 4.503663E−21 | 2.750064E−17 |
| X4Y3 | −6.165900E−20 | −1.819882E−16 | 9.500004E−19 | 5.093327E−19 | 6.975048E−17 |
| X2Y5 | −6.450596E−20 | −5.028167E−16 | −7.487236E−19 | −5.355581E−20 | 1.183273E−16 |
| Y7 | −1.882361E−19 | −6.370290E−16 | −3.184960E−17 | −7.831759E−18 | −3.265250E−16 |
| X8 | −1.048693E−21 | 9.353875E−20 | −2.946548E−23 | −4.981399E−23 | −2.162296E−20 |
| X6Y2 | −4.067809E−21 | 1.722737E−18 | −3.957637E−22 | −7.759929E−22 | −4.785098E−20 |
| X4Y4 | −6.392603E−21 | 2.388388E−18 | −3.474669E−21 | −1.388204E−21 | 1.683396E−19 |
| X2Y6 | −4.306011E−21 | 3.759365E−18 | −7.844708E−20 | −1.264070E−20 | 4.905048E−19 |
| Y8 | −1.082772E−21 | −5.593020E−19 | −4.955639E−20 | 1.477568E−20 | 7.238759E−19 |
| X8Y | 2.058752E−25 | −2.968341E−21 | 6.066676E−25 | 3.336149E−25 | 1.589975E−22 |
| X6Y3 | 4.345645E−26 | −4.929237E−21 | 3.793145E−26 | 3.825804E−25 | −1.474407E−21 |
| X4Y5 | −1.183496E−25 | −1.544217E−20 | −1.516723E−22 | −1.883906E−23 | −4.165343E−21 |
| X2Y7 | −1.450042E−24 | 1.779423E−20 | −2.735220E−22 | −6.966515E−23 | −9.400947E−21 |
| Y9 | −1.527039E−26 | −1.726700E−20 | 2.024284E−21 | 2.056314E−22 | 1.386113E−20 |
| X10 | −1.411035E−27 | −8.771443E−24 | 6.620612E−28 | 2.588514E−28 | 8.591541E−25 |
| X8Y2 | −6.891715E−27 | −7.870459E−23 | −3.199795E−27 | −4.963208E−28 | 2.599535E−24 |
| X6Y4 | −1.433007E−26 | −6.024561E−23 | 1.036352E−25 | 2.197353E−26 | 4.964855E−24 |
| X4Y6 | −1.323910E−26 | −2.258730E−22 | 1.645668E−24 | 1.595079E−25 | 5.435471E−23 |
| X2Y8 | −8.099107E−27 | −9.345620E−23 | 6.065340E−24 | 5.211054E−25 | 3.747807E−23 |
| Y10 | −1.810577E−27 | −2.114658E−22 | 1.576822E−24 | −7.995265E−25 | −1.077115E−22 |
| X10Y | 3.249450E−31 | −4.285480E−27 | −1.101536E−29 | −3.314654E−30 | −1.356543E−26 |
| X8Y3 | −7.455346E−32 | −1.954962E−25 | −6.868487E−29 | −8.913572E−30 | 6.042362E−27 |
| X6Y5 | −4.676823E−30 | 8.006701E−25 | 8.535223E−28 | 3.459287E−29 | 4.563692E−26 |
| X4Y7 | −8.988744E−30 | −3.936304E−25 | 8.691189E−27 | 2.463778E−28 | 1.280972E−25 |
| X2Y9 | −4.216956E−30 | −6.775848E−26 | −1.018924E−26 | 4.209008E−28 | 1.831560E−25 |
| Y11 | −2.307631E−30 | 2.393434E−25 | −4.040419E−26 | −2.068381E−28 | −6.801747E−26 |
| X12 | −7.564717E−33 | 1.773638E−28 | −1.995442E−33 | −3.113321E−34 | −4.962684E−30 |
| X10Y2 | −4.336386E−32 | 1.577632E−27 | 6.214010E−32 | 5.440575E−33 | 3.520618E−29 |
| X8Y4 | −9.938731E−32 | 4.834034E−27 | −1.467594E−30 | −2.556410E−31 | −4.060290E−28 |
| X6Y6 | −1.359229E−31 | 8.712680E−27 | −1.981651E−29 | −1.489932E−30 | −1.178119E−27 |

-continued

| Coefficient | M8 | M7 | M6 | M5 | M4 |
|---|---|---|---|---|---|
| X4Y8 | −1.095008E−31 | 4.340013E−27 | −8.319439E−29 | −3.228060E−30 | −3.110456E−27 |
| X2Y10 | −4.145032E−32 | 5.119961E−27 | −9.286866E−29 | −7.914690E−30 | 2.335325E−28 |
| Y12 | −7.710697E−33 | 5.298204E−27 | −4.364689E−28 | −5.829507E−30 | 8.292815E−28 |

| Coefficient | M3 | M2 | M1 |
|---|---|---|---|
| CUY | 6.217879E−04 | 1.157019E−03 | 7.419373E−04 |
| CUX | 5.986679E−04 | 9.349540E−04 | 7.285297E−04 |
| KY | −4.603443E+00 | 6.272841E+00 | 5.954480E+00 |
| KX | 9.523434E+00 | −1.629706E+00 | 2.962804E+00 |
| Y | 2.245603E−03 | 1.936345E−03 | −3.651545E−03 |
| X2 | −1.929366E−05 | 5.784845E−06 | −7.828291E−07 |
| Y2 | 8.515994E−06 | 5.463100E−05 | 2.275991E−06 |
| X2Y | −2.631002E−07 | −7.769386E−07 | −3.403936E−08 |
| Y3 | −3.140493E−08 | 5.419380E−08 | −1.116515E−08 |
| X4 | −4.186252E−10 | 5.505780E−10 | −1.163498E−10 |
| X2Y2 | −2.957401E−10 | −4.061254E−10 | −4.476013E−10 |
| Y4 | 2.016701E−10 | −1.787999E−09 | −3.118002E−10 |
| X4Y | −5.200483E−13 | −1.661100E−12 | −1.525536E−14 |
| X2Y3 | −4.950739E−14 | 1.836982E−13 | −8.020507E−15 |
| Y5 | 1.564751E−13 | −1.344679E−12 | −8.854265E−15 |
| X6 | −1.008702E−15 | 8.611069E−16 | −1.698011E−16 |
| X4Y2 | −1.910618E−16 | 1.164712E−14 | −8.212424E−16 |
| X2Y4 | 1.041387E−16 | 4.351373E−15 | −1.345437E−15 |
| Y6 | −9.559745E−17 | −3.359677E−15 | −7.093279E−16 |
| X6Y | −5.457167E−19 | −8.740297E−18 | −2.051373E−20 |
| X4Y3 | −1.165108E−18 | −2.021349E−17 | 1.682317E−20 |
| X2Y5 | −3.883413E−18 | −6.481105E−17 | −3.155240E−19 |
| Y7 | −1.053943E−18 | 6.908952E−19 | −6.833199E−19 |
| X8 | −2.478984E−21 | −2.350868E−21 | −2.532522E−22 |
| X6Y2 | −7.373039E−21 | −8.796115E−21 | −1.904058E−21 |
| X4Y4 | −2.039336E−20 | −2.006415E−19 | −4.681797E−21 |
| X2Y6 | −1.428111E−20 | 9.242057E−20 | −3.752270E−21 |
| Y8 | −3.541803E−21 | 3.326675E−19 | 3.674656E−22 |
| X8Y | −9.625900E−24 | 9.610817E−23 | 1.506119E−25 |
| X6Y3 | −4.144074E−23 | −3.677055E−24 | −3.245025E−25 |
| X4Y5 | −9.037933E−23 | −1.926351E−21 | −3.911754E−24 |
| X2Y7 | 2.786980E−23 | 4.013551E−21 | 8.792942E−24 |
| Y9 | −3.146782E−24 | 1.953746E−20 | 5.151478E−23 |
| X10 | 1.262613E−26 | 1.375325E−25 | −4.652204E−28 |
| X8Y2 | 7.040240E−26 | 1.287845E−24 | −2.617173E−28 |
| X6Y4 | −1.373430E−25 | 2.423392E−24 | −3.657864E−27 |
| X4Y6 | 4.952299E−26 | −1.402876E−23 | −2.389771E−26 |
| X2Y8 | −4.557618E−26 | −6.552825E−23 | −5.174888E−26 |
| Y10 | −5.770569E−27 | −2.086050E−22 | −2.572373E−25 |
| X10Y | −5.009489E−29 | −6.739292E−27 | −2.645758E−30 |
| X8Y3 | −3.066405E−28 | −9.082187E−27 | −5.883114E−31 |
| X6Y5 | −1.819436E−28 | −3.852574E−27 | −4.357043E−30 |
| X4Y7 | −2.145886E−29 | 2.020888E−25 | 6.629792E−29 |
| X2Y9 | −2.613061E−28 | −3.741517E−26 | −1.719983E−28 |
| Y11 | 2.667983E−28 | −5.743323E−25 | −4.642218E−28 |
| X12 | −6.319848E−32 | 1.896343E−30 | 8.294632E−34 |
| X10Y2 | −4.242030E−31 | 4.305639E−29 | −1.124264E−32 |
| X8Y4 | −2.424088E−30 | −1.342743E−28 | −1.236651E−31 |
| X6Y6 | −4.615792E−31 | 1.941911E−28 | −1.169995E−32 |
| X4Y8 | −1.682011E−30 | −4.425394E−28 | −2.506850E−31 |
| X2Y10 | −4.609674E−32 | 1.921009E−27 | 4.513020E−31 |
| Y12 | −5.129033E−31 | 7.029922E−27 | 2.521631E−30 |

| Surface | CRA center [°] | AOI max [°] |
|---|---|---|
| M 1 | 13.6 | 15.4 |
| M 2 | 14.5 | 17.1 |
| M 3 | 16.3 | 17.8 |
| M 4 | 14.7 | 17.2 |
| M 5 | 17.2 | 18.4 |
| M 6 | 7.9 | 13 |
| M 7 | 0.2 | 19.1 |
| M 8 | 6.2 | 8.9 |

The projection optical system 7 according to FIG. 3 has an image side numerical aperture NA of 0.50.

The penultimate mirror M7 and a main part of the fourth to last mirror M5 are arranged on the same side of the main plane 23. The imaging beam path between the fourth to last mirror M5 and the third to last mirror M6, on the one hand, and the imaging light bundle 22 in the region of the image field 8 of the projection optical system 7 according to FIG. 3, on the other hand, are guided on different sides of the imaging beam path section 21.

In the projection optical system 7 according to FIG. 3, the mirrors M1, M3, M5, M6 and M8 are configured as concave mirrors. The mirrors M2, M4 and M7 are configured as convex mirrors.

The mirrors M1 to M5 all have a negative chief ray magnification. The mirrors M6 and M7 have a positive chief ray magnification.

The projection optical system 7 according to FIG. 3 also has precisely one intermediate image. A pupil plane 17 between the object field 4 and this intermediate image located in the intermediate image plane 19 is located in the imaging beam path between the mirrors M3 and M4 at a position which is intersected precisely once by the imaging beam path. This means that at the pupil plane 17 an aperture stop can be positioned between the mirrors M3 and M4, such an aperture stop being passed precisely once by the imaging light path.

The mirrors M5 and M8 are arranged back to back with regard to the orientation of their reflection faces.

The central pupil obscuration in the projection optical system 7 according to FIG. 3 is 3.3%.

The working spacing $d_w$ between the image plane 9 and the portion of the used reflection face of the mirror M7 closest to the image plane is 40 mm. A ratio of this working spacing $d_w$ to the overall length of the projection optical

| Coefficient | M8 | M7 | M6 | M5 | M4 | M3 | M2 | M1 | Object |
|---|---|---|---|---|---|---|---|---|---|
| Y-decenter | 0.003 | −111.854 | 174.171 | −125.695 | −193.504 | −549.554 | −667.450 | −893.065 | −1036.690 |
| X-rotation | 6.245 | 12.269 | 19.808 | 10.671 | 8.189 | 6.659 | 4.826 | 5.399 | 0.000 |

The following table gives the values for the angle of incidence "CRA center" of the chief ray 16 of the central point of the object field for the mirrors M1 to M8 and for the maximum angle of incidence "AOI max" being present on those mirrors.

system 7 according to FIG. 3 is 2.4%. The product of this working spacing $d_w$ and the image side numerical aperture NA is 40 mm×0.50=20 mm.

Figure 4:
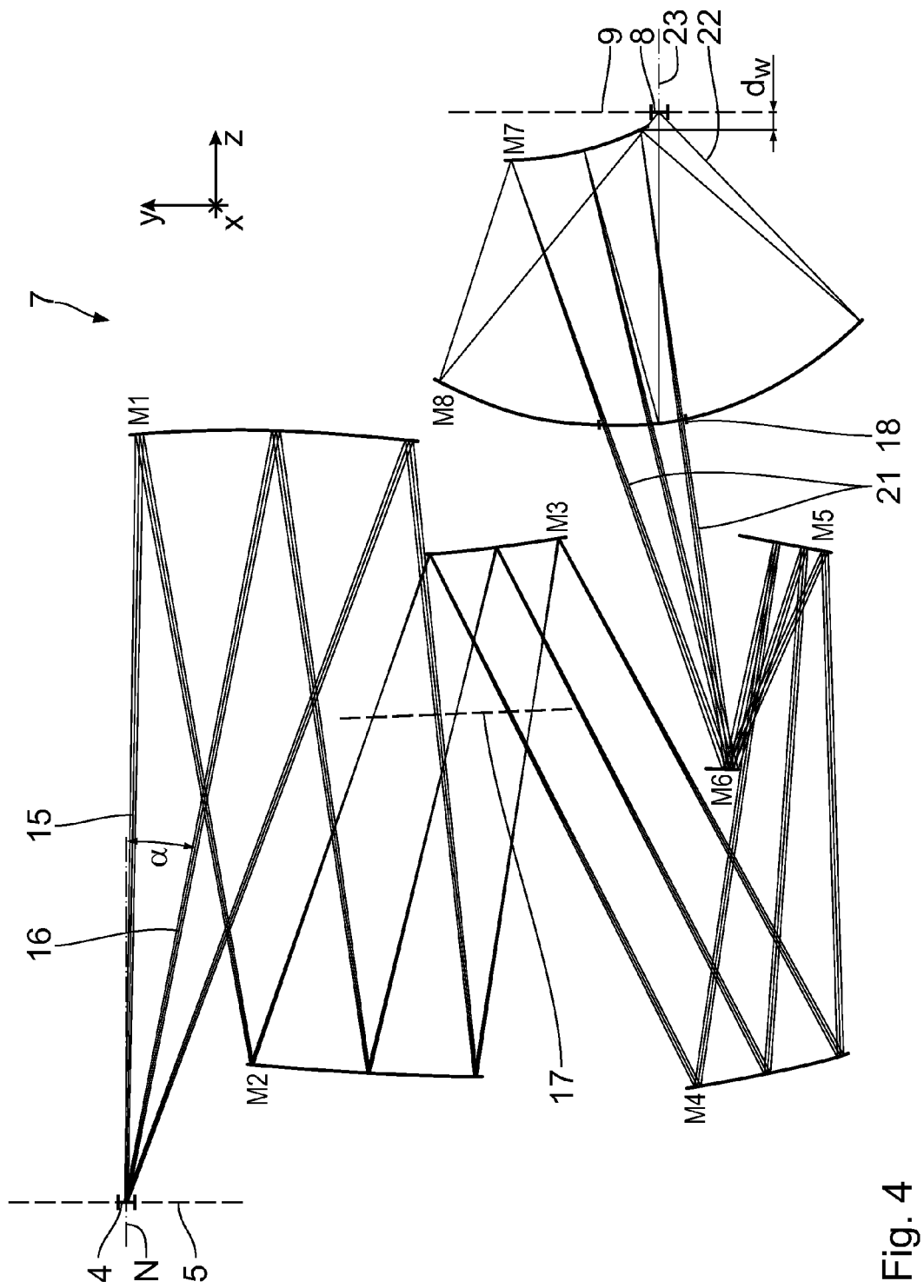

FIG. 4 shows a further embodiment of the projection optical system 7. Components which correspond to those which have already been described above with reference to the projection optical system 7 from FIGS. 2 and 3 have the same reference numerals and are not discussed again in detail.

The mirrors M1 to M8 of the projection optical system 7 according to FIG. 4 are designed as free-form faces which can be described mathematically according to the equations given above with reference to the projection optical system 7 of FIG. 2.

The optical design data of the projection optical system 7 according to FIG. 4 can be inferred from the following tables, which correspond to the tables of the projection optical system 7 according to FIG. 2 with regard to their structure.

| Surface | Radius | Thickness | Mode |
|---|---|---|---|
| Object | INFINITY | 1200.000 | |
| M1 | −2785.004 | −1000.000 | REFL |
| M2 | −2418.926 | 816.491 | REFL |
| M3 | −6714.751 | −816.491 | REFL |
| M4 | 3738.096 | 816.491 | REFL |
| M5 | 6656.352 | −344.683 | REFL |
| M6 | 1997.465 | 961.693 | REFL |
| M7 | 281.984 | −417.010 | REFL |
| M8 | 535.512 | 477.010 | REFL |
| Image | INFINITY | 0.000 | |

| Coefficient | M1 | M2 | M3 | M4 | M5 |
|---|---|---|---|---|---|
| K | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 |
| X2 | −3.039889E+00 | −1.950939E+01 | −3.664497E+00 | 1.632668E+00 | −6.306644E−01 |
| Y2 | −1.114010E+00 | 1.169277E+01 | 1.587920E+01 | 8.263651E+00 | −1.784965E+00 |
| X2Y | 1.915678E−02 | 6.895278E−01 | 3.623781E+00 | 3.933141E+00 | 6.853141E−01 |
| Y3 | −3.093050E−03 | 2.830726E−01 | −7.431903E−01 | −4.188199E+00 | −7.208295E−01 |
| X4 | −1.641088E−02 | −6.074689E+00 | 1.810760E−01 | 2.007144E−01 | 1.830156E−02 |
| X2Y2 | −3.623319E−02 | −4.594613E+00 | −9.264661E−01 | 3.046651E−01 | −5.069118E−03 |
| Y4 | −2.754708E−02 | −4.698222E−01 | −5.821947E+00 | −1.186374E+00 | 4.216116E−02 |
| X4Y | 6.571108E−05 | 1.476163E−01 | 4.530214E−02 | 3.070826E−02 | 3.258732E−03 |
| X2Y3 | −4.650318E−04 | −3.438712E−01 | −3.286636E−02 | 1.347656E−01 | −3.353511E−03 |
| Y5 | −1.854428E−03 | −2.694562E−02 | 1.751086E+00 | −5.391557E−01 | −7.284514E−03 |
| X6 | −9.773129E−05 | −2.281022E+00 | −1.419240E−03 | −1.312553E−02 | −2.377877E−04 |
| X4Y2 | −1.858423E−04 | −1.298678E+00 | 2.817316E−03 | 1.089120E−02 | 2.190687E−04 |
| X2Y4 | −1.012804E−04 | −4.227494E−01 | −3.618355E−01 | 1.094884E−03 | 1.401386E−03 |
| Y6 | −1.262466E−03 | −1.054395E−01 | −3.743455E−01 | −2.858180E−01 | −1.574994E−03 |
| X6Y | 6.921277E−06 | −3.758474E−02 | −5.241247E−03 | −1.790594E−02 | −3.002545E−04 |
| X4Y3 | 3.517879E−05 | 4.326099E−02 | −2.018686E−02 | −9.242751E−04 | −6.760292E−05 |
| X2Y5 | 5.892271E−05 | −9.508278E−03 | −1.189753E−01 | 1.458429E−01 | 6.561671E−04 |
| Y7 | 3.417870E−06 | −5.247070E−03 | −7.357065E−01 | 5.753960E−02 | 1.212678E−02 |
| X8 | −9.554218E−07 | −7.272963E−01 | −6.772300E−04 | 9.100343E−04 | 2.315727E−06 |
| X6Y2 | −4.878138E−06 | −6.858926E−01 | −3.537353E−03 | 2.284795E−02 | 1.764119E−04 |
| X4Y4 | −1.246777E−05 | −2.311884E−01 | −6.041326E−02 | −2.363455E−02 | 4.854455E−04 |
| X2Y6 | 2.520699E−05 | −9.260169E−02 | 1.028803E−01 | −1.438147E−01 | −3.060385E−03 |
| Y8 | 9.372045E−05 | −1.066905E−02 | 3.019114E−01 | −1.225941E−02 | −1.736742E−02 |
| X8Y | −1.473843E−07 | 9.030753E−02 | −1.674129E−04 | −2.618253E−04 | −4.968109E−06 |
| X6Y3 | 2.240777E−08 | 1.711192E−02 | −2.775699E−03 | −1.272334E−02 | −2.587473E−04 |
| X4Y5 | −5.073376E−06 | −8.092571E−02 | −4.574580E−02 | 5.141071E−02 | 1.161995E−04 |
| X2Y7 | 1.126895E−06 | −1.514470E−02 | −3.716869E−01 | −1.593324E−01 | 1.086487E−03 |
| Y9 | −6.854409E−07 | −5.553399E−03 | −2.665498E−02 | 2.686679E−02 | 1.232430E−02 |
| X10 | 8.360519E−09 | −8.995632E−01 | −4.098349E−05 | −3.669565E−04 | −1.216343E−06 |
| X8Y2 | −5.784758E−09 | −1.209616E+00 | 9.603474E−05 | 1.880039E−03 | 1.880606E−05 |
| X6Y4 | 4.556422E−07 | −5.228899E−01 | −1.480464E−02 | 2.134632E−03 | 1.312239E−04 |
| X4Y6 | 3.491760E−07 | −1.140616E−01 | −1.424913E−01 | 3.991324E−02 | −8.938566E−05 |
| X2Y8 | −2.045191E−06 | −4.320081E−03 | −5.676012E−01 | −1.509924E−02 | 7.867206E−05 |
| Y10 | −5.027034E−06 | −4.503141E−03 | −1.036345E+00 | 3.105986E−01 | −3.507499E−03 |
| Nradius | 1.391729E+02 | 1.924891E+02 | 1.901909E+02 | 2.811102E+02 | 1.077461E+02 |

| Coefficient | M6 | M7 | M8 |
|---|---|---|---|
| K | 0.000000E+00 | 0.000000E+00 | 0.000000E+00 |
| Y | 0.000000E+00 | 0.000000E+00 | 0.000000E+00 |
| X2 | −8.131057E−01 | −1.008697E+01 | −6.576175E+00 |
| Y2 | −4.349640E+00 | −5.126869E+00 | −4.967218E+00 |
| X2Y | 2.644947E+00 | 4.756397E−01 | −2.820238E+00 |
| Y3 | −2.482997E+00 | −7.092681E−01 | −1.471917E+00 |
| X4 | 2.077881E−02 | −2.376353E−01 | −6.582380E−01 |
| X2Y2 | −8.335894E+00 | −1.085335E+00 | −2.669898E+00 |
| Y4 | −8.022227E−01 | −1.615067E−01 | −1.063132E+00 |
| X4Y | 1.172971E−03 | −4.077595E−02 | −6.629103E−01 |
| X2Y3 | −1.306658E−01 | 2.038882E−01 | −1.163807E+00 |
| Y5 | −4.437906E−01 | 3.950093E−03 | −3.484713E−01 |
| X6 | −6.041670E−03 | −1.754535E−02 | −1.288779E−01 |
| X4Y2 | 2.714305E−02 | −1.401903E−02 | −5.882216E−01 |
| X2Y4 | −2.861737E−01 | −5.472869E−02 | −5.266178E−01 |
| Y6 | 1.075999E+00 | −5.312186E−02 | −2.020603E−01 |
| X6Y | −1.358117E−02 | 3.333989E−03 | −1.309341E−01 |
| X4Y3 | 1.068399E−01 | −1.044041E−02 | −2.637617E−01 |
| X2Y5 | 1.304566E+00 | −3.122682E−02 | −7.503038E−02 |
| Y7 | −3.987953E+00 | 1.736946E−02 | −7.223693E−02 |
| X8 | 1.565750E−03 | −9.944687E−04 | −3.033169E−02 |
| X6Y2 | −2.097238E−02 | −5.850469E−03 | −1.360298E−01 |
| X4Y4 | −2.418424E−02 | −5.126173E−03 | −6.092184E−02 |
| X2Y6 | −4.574111E+00 | 1.777025E−02 | 2.762866E−02 |
| Y8 | 9.356781E−04 | 9.192638E−04 | −5.172238E−02 |
| X8Y | 5.034875E−03 | 1.321681E−05 | −3.921662E−02 |
| X6Y3 | 7.691805E−03 | 1.782803E−03 | −8.902717E−02 |
| X4Y5 | 3.770025E−02 | 4.104413E−03 | 3.316059E−02 |
| X2Y7 | 7.720410E+00 | −4.353102E−03 | 4.891373E−02 |

-continued

| Coefficient | M6 | M7 | M8 |
|---|---|---|---|
| Y9 | −1.592960E+01 | −4.166954E−03 | −2.555542E−02 |
| X10 | −8.778750E−04 | −1.361528E−04 | −1.044028E−02 |
| X8Y2 | 3.190780E−03 | −7.336917E−03 | −3.156938E−02 |
| X6Y4 | 9.102337E−03 | −2.273357E−03 | −2.912910E−02 |
| X4Y6 | 1.546002E−01 | −3.259798E−03 | 2.214124E−02 |
| X2Y8 | −5.454932E+00 | −1.021359E−03 | 1.158631E−02 |
| Y10 | 1.289602E+01 | 8.306512E−04 | −1.011702E−02 |
| Nradius | 1.822330E+02 | 9.125522E+01 | 3.502938E+02 |

| Coefficient | M1 | M2 | M3 | M4 | M5 | M6 | M7 | M8 | Image |
|---|---|---|---|---|---|---|---|---|---|
| Y-decenter | −49.248 | −192.310 | −392.117 | −819.357 | −874.004 | −759.826 | −529.540 | −461.260 | 0.000 |
| X-rotation | −1.429 | −2.805 | 6.936 | 11.898 | −11.077 | −2.432 | 14.294 | −11.469 | 0.000 |

The following table gives the values for the angle of incidence "CRA center" of the chief ray 16 of the central point of the object field for the mirrors M1 to M8 and for the maximum angle of incidence "AOI max" being present on those mirrors.

| Surface | CRA center [°] | AOI max [°] |
|---|---|---|
| M 1 | 9.6 | 13.3 |
| M 2 | 10.9 | 15.8 |
| M 3 | 20.7 | 23.6 |
| M 4 | 15.7 | 17.7 |
| M 5 | 7.3 | 13.4 |
| M 6 | 15.9 | 22.2 |
| M 7 | 0.8 | 26.8 |
| M 8 | 7.6 | 10.7 |

The projection optical system 7 according to FIG. 4 has an image side numerical aperture NA of 0.70.

The mirror M5 and the mirror M7 are arranged on different sides of the main plane 23.

The mirrors M3 and M8 on the one hand, and the mirrors M5 and M8, on the other hand, in the projection optical system 7 according to FIG. 4, are arranged back to back.

The mirrors M3 and M8 as well as the mirrors M5 and M8 are arranged back to back with regard to the orientation of their reflection faces.

The projection optical system of FIG. 4 has precisely one intermediate image.

The mirrors M1 to M4 and M6 have negative chief ray magnification. The mirrors M5 and M7 have a positive chief ray magnification.

The central pupil obscuration, in the projection optical system 7 according to FIG. 4, is 6.3%. The working spacing $d_w$ between the image plane 9 and the portion of the used reflection face of the mirror M7 closest to the image plane is 25 mm in the projection optical system according to FIG. 4. A ratio of this working spacing $d_w$ to the overall length of the projection optical system 7 according to FIG. 4 is 1.5%. The product of this working spacing $d_w$ and the image side numerical aperture NA is 25 mm×0.70=17.5 mm.

Figure 5:
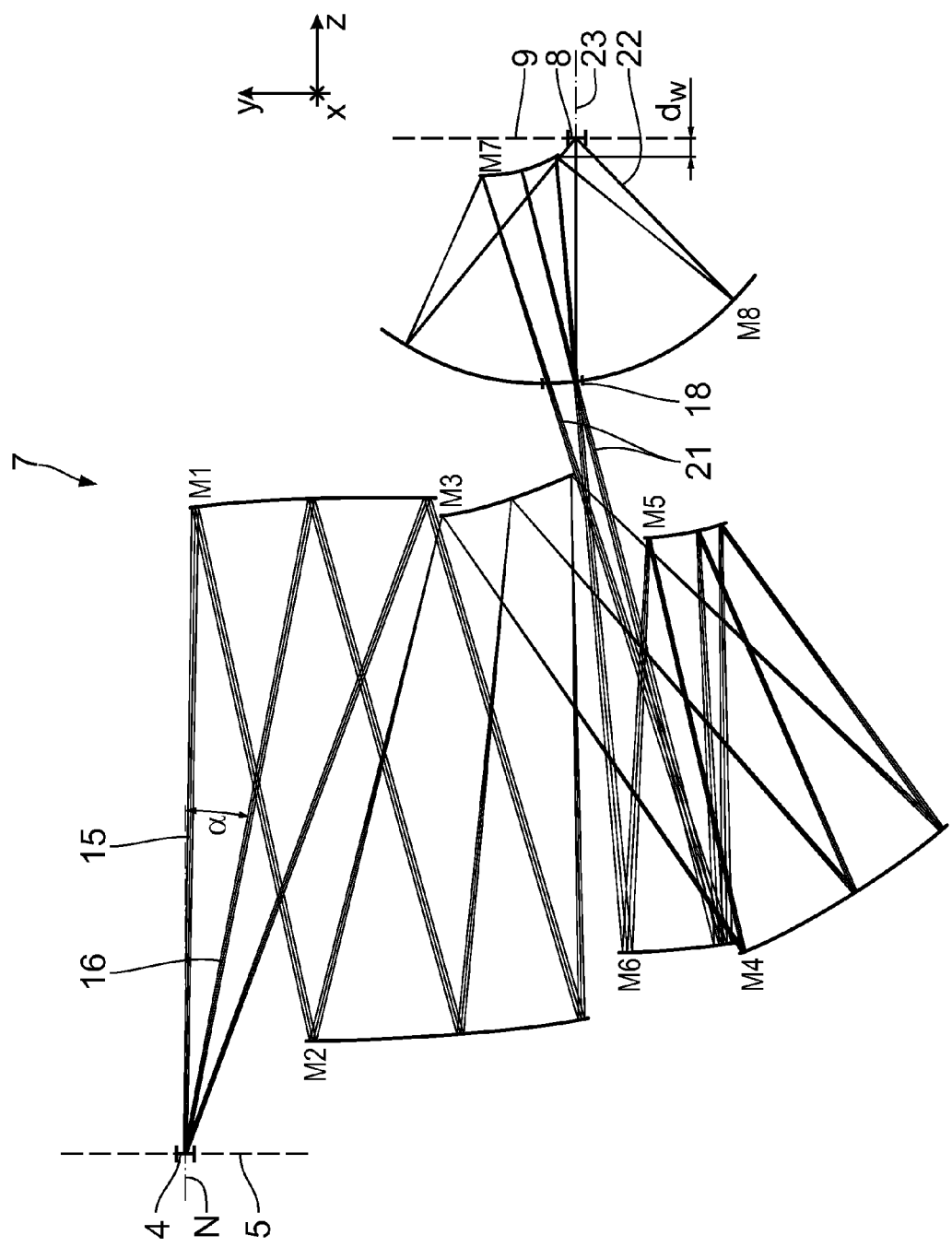

FIG. 5 shows a further embodiment of the projection optical system 7. Components, which correspond to those which have already been described above with reference to the projection optical system 7 from FIG. 2 to 4 have the same reference numerals and are not discussed again in detail.

The optical design data of the projection optical system 7 according to FIG. 5 can be inferred from the following tables, which correspond to the tables of the projection optical system 7 according to FIG. 2 with regard to their structure.

| Surface | Radius | Thickness | Mode |
|---|---|---|---|
| Object | INFINITY | 1161.966 | |
| M1 | −31263.637 | −949.126 | REFL |
| M2 | −726.664 | 947.952 | REFL |
| M3 | 24108.976 | −699.574 | REFL |
| M4 | 919.903 | 642.598 | REFL |
| M5 | 266.364 | −733.610 | REFL |
| M6 | 1455.611 | 1369.794 | REFL |
| M7 | −2010.96 | −376.278 | REFL |
| M8 | 451.922 | 436.278 | REFL |
| Image | INFINITY | 0.000 | |

| Coefficient | M1 | M2 | M3 | M4 | M5 |
|---|---|---|---|---|---|
| K | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 |
| X2 | −3.258372E+01 | −1.219798E−01 | −2.953079E+01 | −4.168140E+01 | −6.985888E+00 |
| Y2 | −1.526516E+01 | 1.176362E+01 | 6.612228E+01 | −2.810949E+01 | −1.365591E+01 |
| X2Y | 1.312302E+00 | 5.191625E+00 | 8.698489E−01 | −8.859573E+00 | −2.953383E+00 |
| Y3 | 1.493382E+00 | 7.693872E−02 | 1.628570E+00 | −7.802472E+00 | −2.451249E+00 |
| X4 | −5.489775E−01 | −4.557557E−01 | −8.536037E−01 | −4.861520E+00 | −1.145126E+00 |
| X2Y2 | −9.990567E−01 | −4.598052E−02 | 4.700149E+00 | −6.969518E+00 | −2.249606E+00 |
| Y4 | 1.535396E−01 | 5.205893E−02 | 2.500124E+01 | −1.759428E+00 | −8.401452E−01 |
| X4Y | 1.733835E−02 | 6.616423E−02 | −1.926779E+00 | −4.073684E−01 | −1.406897E−01 |
| X2Y3 | −9.790169E−02 | 1.245728E−02 | −1.428010E+00 | −1.694100E+00 | −6.903152E−01 |
| Y5 | 1.355137E−01 | 1.874823E−03 | 2.869180E+01 | −9.927794E−01 | −4.750560E−01 |
| X6 | −1.759855E−02 | −5.100225E−02 | −9.240588E−02 | −4.411115E−01 | −1.592384E−01 |
| X4Y2 | −4.552339E−02 | −2.224730E−02 | −4.959436E−01 | −6.405673E−01 | −2.406270E−01 |
| X2Y4 | −2.819621E−02 | 5.344684E−04 | 3.988065E+00 | 1.739222E−01 | 1.602681E−01 |

-continued

| Coefficient | M1 | M2 | M3 | M4 | M5 |
|---|---|---|---|---|---|
| Y6 | 6.902903E−02 | 8.325394E−04 | 2.627178E+00 | −6.339041E−01 | −1.658128E−02 |
| X6Y | 3.372852E−03 | 1.135036E−02 | 4.066538E−01 | 1.674889E−01 | 1.752822E−03 |
| X4Y3 | 1.250821E−02 | 3.595730E−03 | −3.103456E+00 | 5.382307E−01 | −2.231439E−01 |
| X2Y5 | 3.992684E−02 | 3.124811E−04 | −5.631099E+00 | 6.692196E−01 | −3.131178E−01 |
| Y7 | 2.315183E−01 | 1.299816E−04 | 6.949971E+01 | 5.475693E−02 | −9.688856E−02 |
| X8 | −1.732701E−03 | −8.337796E−03 | 7.642953E−02 | −6.928293E−03 | −1.479787E−02 |
| X6Y2 | −3.401082E−03 | −4.933462E−03 | 1.278219E−01 | 1.388569E−01 | −1.970321E−02 |
| X4Y4 | −7.053083E−03 | −4.792916E−04 | 7.521857E+00 | 6.597841E−01 | 4.048260E−02 |
| X2Y6 | 1.767130E−03 | −2.296162E−05 | 1.343779E+01 | 5.139437E−02 | −1.565422E−01 |
| Y8 | 2.737297E−02 | −1.766605E−05 | −6.772541E+01 | 2.284595E−01 | 1.454525E−01 |
| X8Y | −8.690654E−04 | 3.092517E−03 | 2.293432E−01 | 1.148039E−01 | 3.675066E−03 |
| X6Y3 | −5.787668E−04 | 1.157535E−03 | 4.294868E+00 | 4.846608E−01 | −7.149047E−02 |
| X4Y5 | −5.705029E−03 | 8.073174E−05 | 1.552612E+01 | 1.120436E+00 | 7.572720E−02 |
| X2Y7 | −3.612100E−02 | 3.950700E−05 | 4.967685E+01 | 4.074027E−01 | 1.708312E−01 |
| Y9 | −7.157253E−02 | 2.715147E−06 | 1.954721E+02 | −4.317552E−01 | −8.136007E−02 |
| X10 | 6.133315E−04 | −2.627836E−04 | −5.113949E−03 | −3.292934E−03 | −7.845712E−03 |
| X8Y2 | 9.029311E−04 | −6.151560E−04 | 3.816816E−01 | 7.049261E−02 | −1.736614E−02 |
| X6Y4 | 1.624498E−03 | −1.082675E−04 | 2.713110E+00 | 4.209917E−01 | −4.801981E−03 |
| X4Y6 | 6.871212E−03 | −2.036203E−06 | 2.012507E+01 | 7.872400E−01 | −1.317604E−01 |
| X2Y8 | −2.161491E−02 | −6.824072E−06 | 7.700998E+01 | 1.077018E+00 | −8.261428E−02 |
| Y10 | −9.354924E−03 | −1.355903E−07 | 2.991161E+02 | 5.760941E−01 | 8.770952E−04 |
| Nradius | 3.194791E+02 | 1.167936E+02 | 3.931871E+02 | 3.991943E+02 | 1.232068E+02 |

| Coefficient | M6 | M7 | M8 |
|---|---|---|---|
| K | 0.000000E+00 | 0.000000E+00 | 0.000000E+00 |
| Y | 0.000000E+00 | 0.000000E+00 | 0.000000E+00 |
| X2 | 9.849253E+00 | 1.067347E+01 | −4.281964E+00 |
| Y2 | 7.592142E+00 | 1.555716E+01 | −3.334926E+00 |
| X2Y | −8.839306E−01 | 3.095145E−01 | −1.718961E+00 |
| Y3 | −8.332959E−01 | 7.559278E−01 | −2.469636E−01 |
| X4 | 4.596967E−01 | 3.820446E−01 | −5.171758E−01 |
| X2Y2 | 6.878113E−01 | 9.843236E−01 | −7.924602E−01 |
| Y4 | 2.795789E−01 | 2.049731E−01 | −4.717540E−01 |
| X4Y | −5.028602E−02 | 8.745504E−02 | −1.802765E−01 |
| X2Y3 | −2.017370E−01 | 7.365305E−02 | −6.206105E−01 |
| Y5 | −8.520163E−02 | 1.496849E−01 | −1.110232E−01 |
| X6 | 2.532391E−02 | 3.765248E−02 | −1.388330E−01 |
| X4Y2 | 9.128300E−02 | 8.660659E−02 | −3.031028E−01 |
| X2Y4 | 3.045698E−01 | 5.780761E−02 | −2.989862E−01 |
| Y6 | −3.970140E−01 | 4.455236E−02 | −8.689672E−02 |
| X6Y | −1.939764E−03 | 1.768614E−02 | −1.614767E−02 |
| X4Y3 | −1.227430E−01 | 2.126818E−02 | −1.526322E−01 |
| X2Y5 | −7.635510E−01 | 6.478870E−02 | −1.767268E−01 |
| Y7 | 7.594021E−01 | 1.515328E−02 | −2.537528E−02 |
| X8 | 3.156230E−03 | 2.539496E−03 | −3.125581E−02 |
| X6Y2 | 4.227980E−02 | 3.498066E−03 | −1.298464E−01 |
| X4Y4 | 3.626897E−01 | 3.280708E−02 | −1.552541E−01 |
| X2Y6 | 1.179739E+00 | 3.181044E−02 | −9.841456E−02 |
| Y8 | −9.601880E−01 | 9.707115E−03 | −2.214437E−02 |
| X8Y | −5.423406E−03 | −4.020635E−03 | −9.534923E−03 |
| X6Y3 | −1.156255E−01 | −9.463449E−03 | −6.040634E−02 |
| X4Y5 | −4.505891E−01 | 7.021303E−03 | −1.025763E−01 |
| X2Y7 | −1.066607E+00 | 1.154201E−03 | −5.962207E−02 |
| Y9 | 1.240254E+00 | −6.239957E−03 | −5.045564E−03 |
| X10 | −2.763743E−04 | 3.528049E−03 | −1.447104E−02 |
| X8Y2 | 1.634679E−02 | 1.809532E−02 | −7.598064E−02 |
| X6Y4 | 1.081320E−01 | 4.069368E−02 | −1.156858E−01 |
| X4Y6 | 2.116470E−01 | 2.711080E−02 | −7.226866E−02 |
| X2Y8 | 4.277131E−01 | 7.919214E−03 | −2.821365E−02 |
| Y10 | −7.512198E−01 | 2.097660E−03 | −5.933799E−03 |
| Nradius | 3.329839E+02 | 8.354899E+01 | 3.136686E+02 |

| Coefficient | M1 | M2 | M3 | M4 | M5 | M6 | M7 | M8 | Image |
|---|---|---|---|---|---|---|---|---|---|
| Y-decenter | −41.863 | −305.565 | −393.410 | −1000.286 | −722.988 | −762.038 | −410.542 | −460.460 | 0.000 |
| X-rotation | 2.264 | 5.116 | 17.824 | 32.141 | 13.194 | 8.719 | 14.430 | 1.524 | 0.000 |

The following table gives the values for the angle of incidence "CRA center" of the chief ray 16 of the central point of the object field for the mirrors M1 to M8 and for the maximum angle of incidence "AOI max" being present on those mirrors.

| Surface | CRA center [°] | AOI max [°] |
|---|---|---|
| M 1 | 13.3 | 18.5 |
| M 2 | 10.4 | 14.1 |
| M 3 | 23.1 | 25.3 |
| M 4 | 8.8 | 13.3 |
| M 5 | 10.1 | 17.8 |
| M 6 | 5.7 | 8.6 |
| M 7 | 0.0 | 28.2 |
| M 8 | 7.2 | 8.4 |

In the imaging beam path of the projection optical system 7 according to FIG. 5, a part of the imaging beam path between the mirrors M4 and M5 lies on the same side of the imaging beam path section 21 as the imaging light bundle 22 in the region of the image field 8. In the embodiment according to FIG. 5, a pupil plane 17 lies in the vicinity of mirror M3 and an intermediate image plane 19 lies between the mirrors M6 and M7.

The mirrors M3 and M8 as well as the mirrors M5 and M8 are arranged back to back with regard to the orientation of their reflection faces.

The imaging beam path section 21 propagates through a space between the neighboring mirrors M3 and M5.

The projection optical system of FIG. 5 has precisely one intermediate image.

The mirrors M1 to M3 have negative chief ray magnification. The mirror M4 has a positive chief ray magnification.

The central pupil obscuration in the projection optical system 7 according to FIG. 5 is 4.4%. The working spacing $d_w$ between the image plane 9 and the portion of the used reflection face of the mirror M7 closest to the image plane is 35 mm. A ratio of this working space $d_w$ to the overall length of the projection optical system according to FIG. 5 is 2.0%. The product of this working spacing $d_w$ and the image side numerical aperture NA is 35 mm×0.70=24.5 mm.

The projection optical system 7 according to FIG. 5 has a numerical aperture NA on the image side of 0.7.

Figure 6:
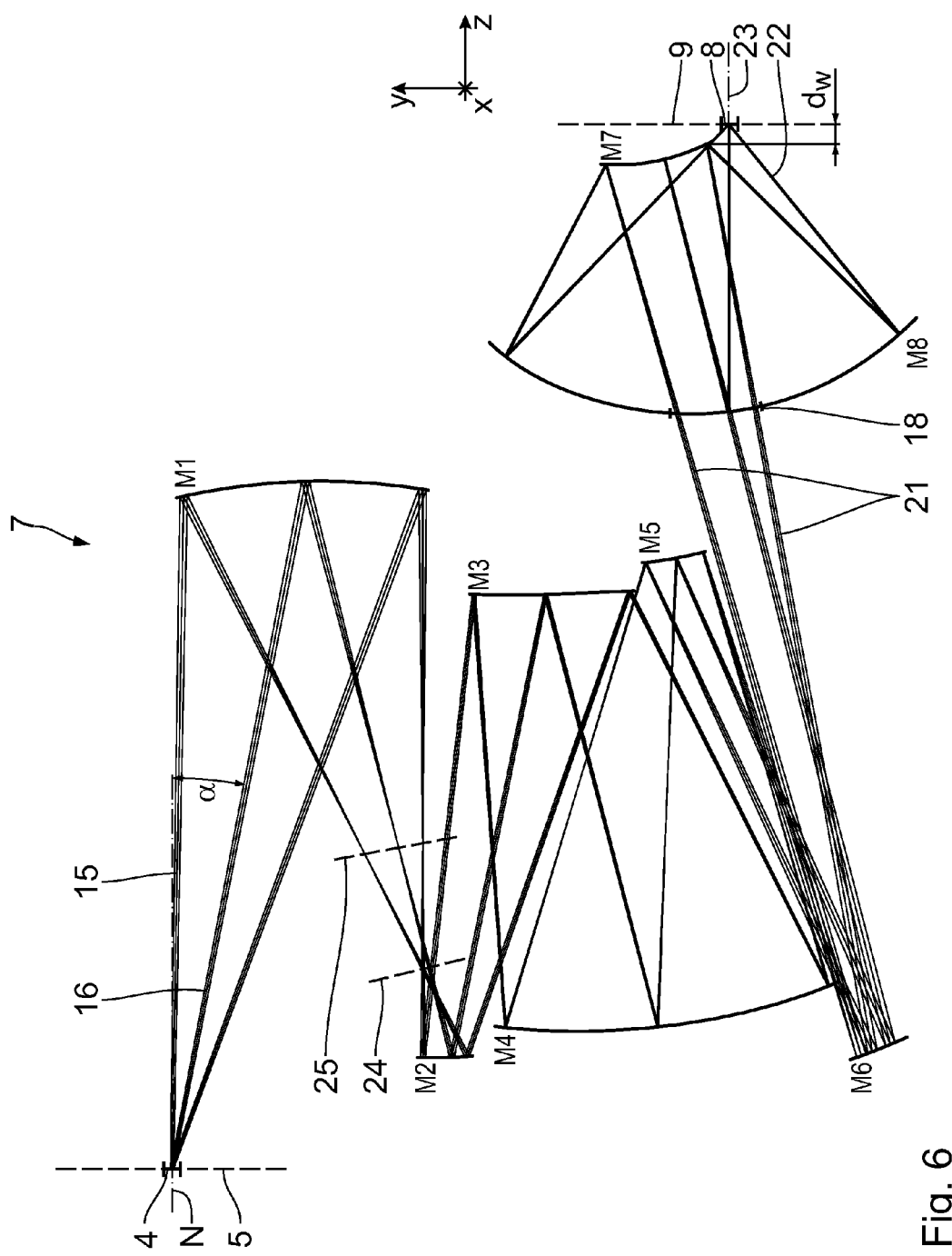

FIG. 6 shows a further embodiment of the projection optical system 7. Components which correspond to those which have already been described above with reference to the projection optical system 7 from FIG. 2 to 5 and in particular with reference to the projection optical system 7 of FIG. 3 have the same reference numerals and will not be discussed again in detail.

The optical design data of the projection optical system 7 according to FIG. 6 can be inferred from the following tables, which correspond to the tables of the projection optical system 7 according to FIG. 2 with regard to their structure.

| Surface | Radius | Thickness | Mode |
|---|---|---|---|
| Object | INFINITY | 1186.307 | |
| M1 | −1057.067 | −996.274 | REFL |
| M2 | −171.65 | 800.000 | REFL |
| M3 | −3390.883 | −747.673 | REFL |
| M4 | 2967.537 | 810.338 | REFL |
| M5 | 901.556 | −838.004 | REFL |
| M6 | 1453.056 | 1525.307 | REFL |
| M7 | 1342.674 | −440.000 | REFL |
| M8 | 533.536 | 500.000 | REFL |
| Image | INFINITY | 0.000 | |

| Coefficient | M1 | M2 | M3 | M4 | M5 |
|---|---|---|---|---|---|
| K | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 |
| X2 | 3.046566E+00 | 1.064196E+01 | −6.877734E+00 | −6.551249E+00 | −4.573647E+01 |
| Y2 | −9.345631E−01 | 9.287262E+00 | 8.387613E+00 | 1.519717E+01 | 6.570915E+01 |
| X2Y | 1.310350E+00 | 3.555893E−02 | 3.530965E+00 | −9.404541E−01 | 6.130253E+00 |
| Y3 | 1.263724E+00 | 4.292421E−02 | 6.688290E−01 | −4.943060E−01 | −8.254876E+00 |
| X4 | 3.465670E−01 | 1.368611E−01 | 4.168167E−01 | 3.950788E−01 | −1.632324E+00 |
| X2Y2 | 3.686165E−01 | 2.826143E−01 | 4.548015E−01 | 8.139705E−01 | 2.581356E+01 |
| Y4 | −2.955880E−01 | 1.279130E−01 | 8.618199E−01 | 2.578137E−01 | 1.142839E+01 |
| X4Y | 1.388350E−01 | −2.062190E−03 | −1.023555E−01 | −2.173318E−02 | 8.106282E+00 |
| X2Y3 | 6.394936E−01 | −1.020434E−02 | 4.243009E−01 | −1.962551E−01 | −2.483329E+01 |
| Y5 | 7.905554E−01 | −1.557739E−02 | −9.255935E−02 | −3.405651E−02 | 2.694276E+02 |
| X6 | 2.617373E−02 | 7.844020E−03 | 3.081821E−02 | −6.861022E−02 | −6.100639E−01 |
| X4Y2 | 1.959395E−02 | 2.415746E−02 | 2.964292E−01 | 1.528241E−01 | −2.248702E+00 |
| X2Y4 | 1.720147E−02 | 4.531030E−02 | 3.540745E−01 | 2.274938E−01 | 8.222398E+01 |
| Y6 | −6.633964E−02 | 2.972322E−02 | 5.257411E−01 | −1.542362E−02 | −3.356155E+02 |
| X6Y | −5.472350E−03 | 4.354398E−04 | 0.000000E+00 | −2.594216E−02 | 0.000000E+00 |
| X4Y3 | −2.651224E−02 | 3.994861E−04 | 0.000000E+00 | −5.201138E−02 | 0.000000E+00 |
| X2Y5 | −1.191772E−01 | −6.180427E−03 | 0.000000E+00 | −2.787381E−02 | 0.000000E+00 |
| Y7 | −1.524798E−01 | −6.434917E−03 | 0.000000E+00 | −3.797224E−04 | 0.000000E+00 |
| Nradius | 3.112287E+02 | 5.000222E+01 | 1.777855E+02 | 2.427254E+02 | 3.512329E+02 |

| Coefficient | M6 | M7 | M8 |
|---|---|---|---|
| K | 0.000000E+00 | 0.000000E+00 | 0.000000E+00 |
| Y | 0.000000E+00 | 0.000000E+00 | 0.000000E+00 |
| X2 | −4.024996E+00 | 1.268827E+01 | −3.610149E+00 |
| Y2 | 3.505892E+00 | 2.487528E+01 | −3.384839E+00 |
| X2Y | 7.142856E−02 | 1.049660E+01 | −1.673243E+00 |
| Y3 | 1.505081E−01 | 4.493650E+00 | 3.862136E−01 |
| X4 | −4.105825E−02 | 5.683165E−01 | −2.452075E−01 |
| X2Y2 | 3.828386E−01 | 9.603197E−01 | −8.621442E−01 |
| Y4 | 2.995281E−01 | 3.063827E+00 | −2.565034E−01 |
| X4Y | 1.409606E−02 | 1.040280E+00 | −1.604729E−01 |
| X2Y3 | 1.782779E−02 | 2.799100E+00 | −2.378679E−01 |
| Y5 | 1.939092E−01 | −1.824900E+00 | −4.574219E−02 |
| X6 | −5.175487E−03 | −7.523206E−02 | −9.805794E−03 |
| X4Y2 | 1.108354E−02 | 1.859196E+00 | −3.526866E−02 |
| X2Y4 | −2.403335E−01 | 7.394908E−01 | −1.767572E−01 |
| Y6 | −4.605330E−01 | −2.700135E+00 | 7.962477E−03 |
| X6Y | 5.400970E−04 | 1.168550E−01 | −7.737162E−02 |
| X4Y3 | 3.095018E−02 | −7.480038E−02 | −1.136501E−01 |
| X2Y5 | 1.964907E−01 | −1.557412E+00 | −1.040260E−01 |
| Y7 | 2.329587E−01 | 1.305815E+00 | 2.160015E−02 |
| Nradius | 3.023633E+02 | 1.426519E+02 | 3.609954E+02 |

| Coefficient | M1 | M2 | M3 | M4 | M5 | M6 | M7 | M8 | Image |
|---|---|---|---|---|---|---|---|---|---|
| Y-decenter | −46.600 | −300.441 | −465.188 | −656.402 | −687.900 | −1057.048 | −667.984 | −707.697 | 0.000 |
| X-rotation | 1.647 | 1.329 | 1.354 | 6.060 | 10.774 | 19.041 | 14.303 | −0.319 | 0.000 |

The following table gives the values for the angle of incidence "CRA center" of the chief ray 16 of the central point of the object field for the mirrors M1 to M8 and for the maximum angle of incidence "AOI max" being present on those mirrors.

| Surface | CRA center [°] | AOI max [°] |
|---|---|---|
| M 1 | 12.6 | 14.4 |
| M 2 | 13.0 | 23.6 |
| M 3 | 13.0 | 22.4 |
| M 4 | 8.3 | 10.8 |
| M 5 | 13.0 | 21.5 |
| M 6 | 4.7 | 7.4 |
| M 7 | 0.0 | 27.6 |
| M 8 | 7.2 | 8.9 |

The imaging beam path between the object field 4 and the image field 8 in the projection optical system 7 according to FIG. 6 is comparable to the imaging beams path in the embodiment according to FIG. 3. The numerical aperture NA on the image side of the projection optical system 7 according to FIG. 6 is 0.70.

The imaging beam path of the projection optical system 7 according to FIG. 6 between the object field 4 and the mirror M5 lies on the same side of the main plane 23 as the mirror M7. Regarding the imaging beam path section 21, the imaging beam path between the object field 4 and the mirror M5 on the one hand and the imaging light bundle 22 in the region of the image field 8 on the other hand lie on different sides.

The projection optical system 7 according to FIG. 6 has precisely two intermediate images. A first intermediate image lies in an intermediate image plane 24 which is located in the imaging beam path between the mirrors M1 and M2. The second intermediate image lies in the beam path between the mirrors M5 and M7.

A first internal pupil plane 25 of the projection optical system 7 according to FIG. 6 lies between the mirror M1 and the intermediate image plane 24. This pupil plane 25 lies at a position of the imaging beam path which is intersected by the imaging beam bundle precisely once.

A further pupil plane lies between the two intermediate images of the projection optical system 7 according to FIG. 6 in the vicinity of mirror M5.

The mirrors M5 and M8 are arranged back to back.

The mirrors M1 to M5 have negative chief ray magnification. The mirror M6 and M7 have a positive chief ray magnification.

The central pupil obscuration, in the projection optical system 7 according to FIG. 6, is 7.8%. The working spacing $d_w$ between the image plane 9 and the portion of the used reflection face of the mirror M7 closest to the image plane is 31 mm in the projection optical system according to FIG. 6. A ratio of this working spacing $d_w$ to the overall length of the projection optical system 7 according to FIG. 6 is 1.7%. The product of this working spacing $d_w$ and the image side numerical aperture NA is 31 mm×0.70=21.7 mm.

To produce a microstructured or nanostructured component, the projection exposure installation 1 is used as follows: firstly, the reflection mask 10 or the reticle and the substrate or the wafer 11 are provided. A structure on the reticle 10 is then projected onto a light-sensitive layer of the wafer 11 with the aid of the projection exposure installation. By developing the light-sensitive layer, a microstructure or nanostructure is then produced on the wafer 11 and therefore the microstructured component.

What is claimed is:

1. An imaging optical system, comprising:
   a plurality of mirrors configured to image an object field in an object plane into an image field in an image plane via a path of light from the object field to the image field, the plurality of mirrors comprising precisely eight mirrors including a last mirror along the path of the light and a penultimate mirror along the path of the light,
   wherein:
   the path of the light passes through an a opening in the last mirror;
   the penultimate mirror is outside a bundle of the light in front of the image field;
   the imaging optical system has an image side numerical aperture of greater than 0.5;
   the imaging optical system has a pupil obscuration of greater than 0% and less than 10%; and
   a reflective surface of the penultimate mirror is devoid of an opening through which the path of the light passes.

2. The imaging optical system of claim 1, wherein a product of a working spacing of the penultimate mirror and an image side numerical aperture of the imaging optical system is at least 10 mm.

3. The imaging optical system of claim 1, wherein the imaging optical system has at least one intermediate image along the path of the light.

4. The imaging optical system of claim 1, wherein, for each point on the optically used region of the penultimate mirror, an average angle of incidence on the point is less than 25°.

5. The imaging optical system of claim 1, wherein, for each point on the optically used region of the penultimate mirror, a ratio of a bandwidth of angles of incidence on the point to a maximum field dimension of the image field is less than 1.00°/mm.

6. The imaging optical system of claim 1, wherein a chief ray of a central object field point includes an angle with a normal to the object plane of more than 5°.

7. The imaging optical system of claim 1, wherein the penultimate mirror is convex.

8. The imaging optical system of claim 1, wherein the imaging optical system is a microlithography projection optical system.

9. An installation, comprising:
   an imaging optical system according to claim 1; and
   an illumination optical system configured to guide the light to the object field of the imaging optical system,
   wherein the installation is a microlithography projection exposure installation.

10. The installation of claim 9, further comprising a light source configured to produce light having a wavelength of between 5 nm and 30 nm.

11. A method of using a microlithography projection exposure installation comprising an imaging optical system and an illumination optical system, the method comprising:
using the illumination optical system to illuminate a reticle; and
using the imaging optical system to project a structure of the reticle onto a light-sensitive material,
wherein the imaging optical system is an imaging optical system according to claim 1.

12. The imaging optical system of claim 1, wherein:
a main plane extends centrally through the image field;
the main plane is perpendicular to the image field; and
the penultimate mirror is on only one side of the main plane.

13. An imaging optical system, comprising:
a plurality of mirrors configured to image an object field in an object plane into an image field in an image plane, the plurality of mirrors comprising precisely eight mirrors,
wherein the imaging optical system has a pupil obscuration of greater than 0% and less than 5%, a product of a working spacing of the penultimate mirror and an image side numerical aperture of the imaging optical system is at least 10 mm, and the image side numerical aperture is greater than 0.5.

14. The imaging optical system of claim 13, wherein the imaging optical system has at least one intermediate image along the path of the light.

15. The imaging optical system of claim 13, wherein, for each point on the optically used region of the penultimate mirror, an average angle of incidence on the point is less than 25°.

16. The imaging optical system of claim 13, wherein, for each point on the optically used region of the penultimate mirror, a ratio of a bandwidth of angles of incidence on the point to a maximum field dimension of the image field is less than 1.00°/mm.

17. The imaging optical system of claim 13, wherein a chief ray of a central object field point includes an angle with a normal to the object plane of more than 5°.

18. The imaging optical system of claim 13, wherein the penultimate mirror is convex.

19. The imaging optical system of claim 13, wherein the imaging optical system is a microlithography projection optical system.

20. An installation, comprising:
an imaging optical system according to claim 13; and
an illumination optical system configured to guide the light to the object field of the imaging optical system,
wherein the installation is a microlithography projection exposure installation.

21. The installation of claim 20, further comprising a light source configured to produce light having a wavelength of between 5 nm and 30 nm.

22. A method of using a microlithography projection exposure installation comprising an imaging optical system and an illumination optical system, the method comprising:
using the illumination optical system to illuminate a reticle; and
using the imaging optical system to project a structure of the reticle onto a light-sensitive material,
wherein the imaging optical system is an imaging optical system according to claim 13.

23. An imaging optical system, comprising:
a plurality of mirrors configured to image an object field in an object plane into an image field in an image plane, the plurality of mirrors comprising precisely eight mirrors, wherein the imaging optical system has a pupil obscuration of greater than 0% and less than 10%, and a product of a working spacing of the penultimate mirror and an image side numerical aperture of the imaging optical system is at least 10 mm, wherein:
the plurality of mirrors are configured to image the object field in the object plane into the image field in the image plane via a path of light from the object field to the image field;
the precisely eight mirrors include a last mirror along the path of the light and a penultimate mirror along the path of the light;
a main plane extends centrally through the image field;
the main plane is perpendicular to the image field; and
the penultimate mirror is on only one side of the main plane.

24. An imaging optical system, comprising:
a plurality of mirrors configured to image an object field in an object plane into an image field in an image plane, the plurality of mirrors comprising precisely eight mirrors,
wherein the imaging optical system has a pupil obscuration of greater than 0% and less than 5%, and an image side numerical aperture of higher than 0.5.

* * * * *

UNITED STATES PATENT AND TRADEMARK OFFICE
CERTIFICATE OF CORRECTION

PATENT NO. : 9,541,841 B2  
APPLICATION NO. : 13/692030  
DATED : January 10, 2017  
INVENTOR(S) : Hans-Juergen Mann et al.

Page 1 of 1

It is certified that error appears in the above-identified patent and that said Letters Patent is hereby corrected as shown below:

In the Specification

Column 6, Line 62, delete "decenterd" and insert -- decentered --.

Column 18, Line 23, delete "FIG." and insert -- FIGS. --.

In the Claims

Column 24, Line 24, Claim 1, delete "an a" and insert -- an --.

Column 24, Line 45, Claim 4, delete "25° ." and insert -- 25°. --.

Signed and Sealed this  
Twenty-seventh Day of June, 2017

Joseph Matal  
*Performing the Functions and Duties of the*  
*Under Secretary of Commerce for Intellectual Property and*  
*Director of the United States Patent and Trademark Office*